(12) United States Patent
Gao et al.

(10) Patent No.: US 12,495,700 B2
(45) Date of Patent: *Dec. 9, 2025

(54) DISPLAY PANEL AND DISPLAY DEVICE HAVING IMPROVED ELECTROSTATIC DISCHARGE CAPABILITY

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Zhuan Gao, Wuhan (CN); Xinzhao Liu, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/606,246

(22) Filed: Mar. 15, 2024

(65) Prior Publication Data
US 2024/0224674 A1 Jul. 4, 2024

Related U.S. Application Data

(63) Continuation of application No. 17/216,814, filed on Mar. 30, 2021, now Pat. No. 11,957,011.

(30) Foreign Application Priority Data

Dec. 4, 2020 (CN) .......................... 202011415570.9

(51) Int. Cl.
H10K 59/80 (2023.01)
H10K 59/131 (2023.01)

(52) U.S. Cl.
CPC ..... *H10K 59/80521* (2023.02); *H10K 59/131* (2023.02); *H10K 59/8722* (2023.02)

(58) Field of Classification Search
CPC .................... H10K 59/131; H10K 50/8426
See application file for complete search history.

(56) References Cited

U.S. PATENT DOCUMENTS

| 11,957,011 B2 * | 4/2024 | Gao ................. H10K 59/80521 |
| 2003/0094615 A1 | 5/2003 | Yamazaki et al. |

(Continued)

FOREIGN PATENT DOCUMENTS

| CN | 109686866 A | 4/2019 |
| CN | 110032007 A | 7/2019 |

(Continued)

*Primary Examiner* — Lex H Malsawma
(74) *Attorney, Agent, or Firm* — Anova Law Group, PLLC

(57) ABSTRACT

A display panel and a display device are provided. The display panel includes a display region and a frame region surrounding the display region. The display panel also includes a frame adhesive located in the frame region, a padding metal located in the frame region, a cathode signal line located at a side of the frame adhesive adjacent to the display region, a cathode located in the display region, the cathode is electrically connected to the cathode signal line, and at least one connecting part electrically connected to the padding metal and electrically connected to the cathode signal line. Along a direction perpendicular to a plane where the display panel is located, the padding metal at least partially overlaps the frame adhesive.

21 Claims, 13 Drawing Sheets

(56) References Cited

U.S. PATENT DOCUMENTS

| | | | |
|---|---|---|---|
| 2016/0141547 A1 | 5/2016 | Kim et al. | |
| 2016/0343792 A1 | 11/2016 | Jang | |
| 2019/0312097 A1* | 10/2019 | Choi | H10D 86/443 |
| 2020/0357878 A1* | 11/2020 | Jo | H10K 59/131 |
| 2020/0411630 A1 | 12/2020 | Kim et al. | |
| 2021/0066437 A1 | 3/2021 | Ryu et al. | |
| 2021/0083038 A1 | 3/2021 | Jeon et al. | |

FOREIGN PATENT DOCUMENTS

| | | |
|---|---|---|
| CN | 110070798 A | 7/2019 |
| CN | 110085118 A | 8/2019 |
| CN | 112014677 A | 12/2020 |

* cited by examiner

DISPLAY PANEL AND DISPLAY DEVICE HAVING IMPROVED ELECTROSTATIC DISCHARGE CAPABILITY

CROSS-REFERENCE TO RELATED APPLICATION

This application is a continuation of U.S. application Ser. No. 17/216,814, filed on Mar. 30, 2021, which claims the priority of Chinese patent application No. 202011415570.9, filed on Dec. 4, 2020, the entireties of both of which are incorporated herein by reference.

FIELD

The present disclosure generally relates to the field of display technology and, more particularly, relates to a display panel and a display device.

BACKGROUND

Conventional display panels include a liquid crystal display panel, a plasma display panel, an organic light-emitting diode (OLED) display panel, etc. Such display panels can be used in consumer electronics such as a mobile phone, a camcorder, a notebook computer, a desktop display, and a projection TV, etc., or computer products. Organic light-emitting diode (OLED) display panel is featured with advantages of lightness, thinness, and power saving, and has been widely used in various display devices.

Because the organic light-emitting diode device is substantially sensitive to water and oxygen in air, the water and oxygen that penetrate into the organic light-emitting diode device will seriously affect the service life of the organic light-emitting diode device. Therefore, the organic light-emitting diode device needs to be packaged through a packaging structure, and the packaging structure is used to block water and oxygen. Currently, laser-assisted glass frit encapsulation is a widely used encapsulation method for the organic light-emitting diode device. The laser-assisted glass frit encapsulation refers to disposing a glass barrier spacer between the organic light-emitting diode display substrate and the glass cover that are oppositely arranged, where the glass barrier spacer is used to seal and support the organic light-emitting diode display substrate and the glass cover. Therefore, the organic light-emitting diode device is located in a closed cavity enclosed by the organic light-emitting diode display substrate, the glass cover and the glass barrier spacer, such that water and oxygen are prevented from penetrating into the inside of the organic light-emitting diode device.

In the existing technology, before the display device leaves the factory, an electrostatic protection test needs to be performed on the display device. During the electrostatic protection test, when the screen gets struck by static charge, the glass barrier spacer may be damaged, which causes failure of the encapsulation.

Therefore, how to provide a display panel and a display device, that are capable of improving the static charge protection capability, quickly dispersing the static charge after the static charge enters the screen, and facilitating to improve the product yield and display quality, is an urgent technical problem to be solved. The disclosed display panel and display device are directed to solve one or more problems set forth above and other problems.

SUMMARY

One aspect of the present disclosure provides a display panel. The display panel includes a display region and a frame region surrounding the display region. The display panel also includes a frame adhesive located in the frame region, a padding metal located in the frame region, a cathode signal line located at a side of the frame adhesive adjacent to the display region, a cathode located in the display region, the cathode is electrically connected to the cathode signal line, and at least one connecting part electrically connected to the padding metal and electrically connected to the cathode signal line. Along a direction perpendicular to a plane where the display panel is located, the padding metal at least partially overlaps the frame adhesive.

Another aspect of the present disclosure provides a display device. The display device includes a display panel. The display panel includes a display region and a frame region surrounding the display region. The display panel also includes a frame adhesive located in the frame region, a padding metal located in the frame region, a cathode signal line located at a side of the frame adhesive adjacent to the display region, a cathode located in the display region, the cathode is electrically connected to the cathode signal line, and at least one connecting part electrically connected to the padding metal and electrically connected to the cathode signal line. Along a direction perpendicular to a plane where the display panel is located, the padding metal at least partially overlaps the frame adhesive.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
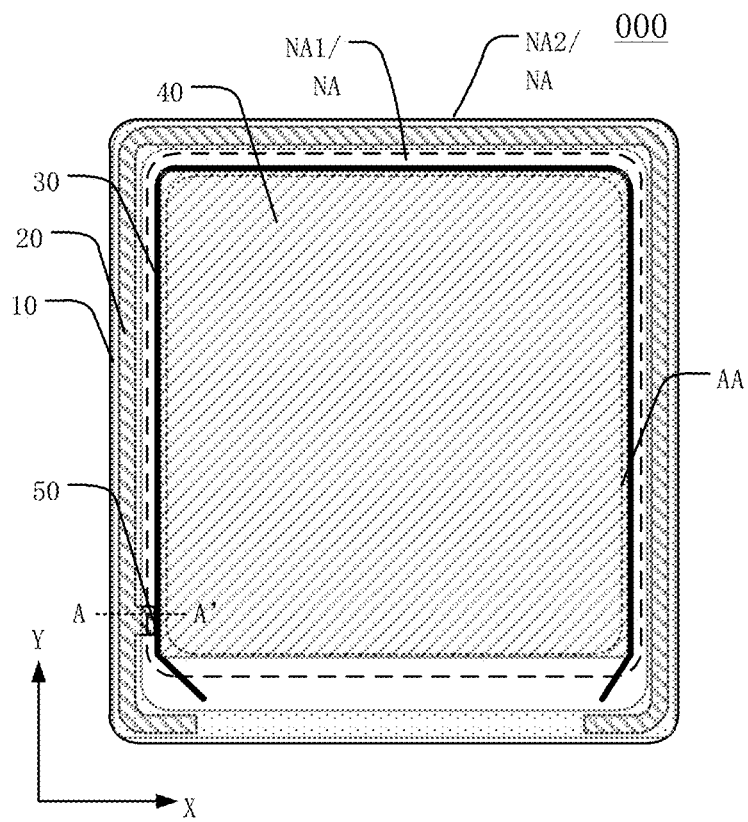
FIG. 1 illustrates a schematic top view of an exemplary display panel consistent with disclosed embodiments of the present disclosure.
Figure 2:
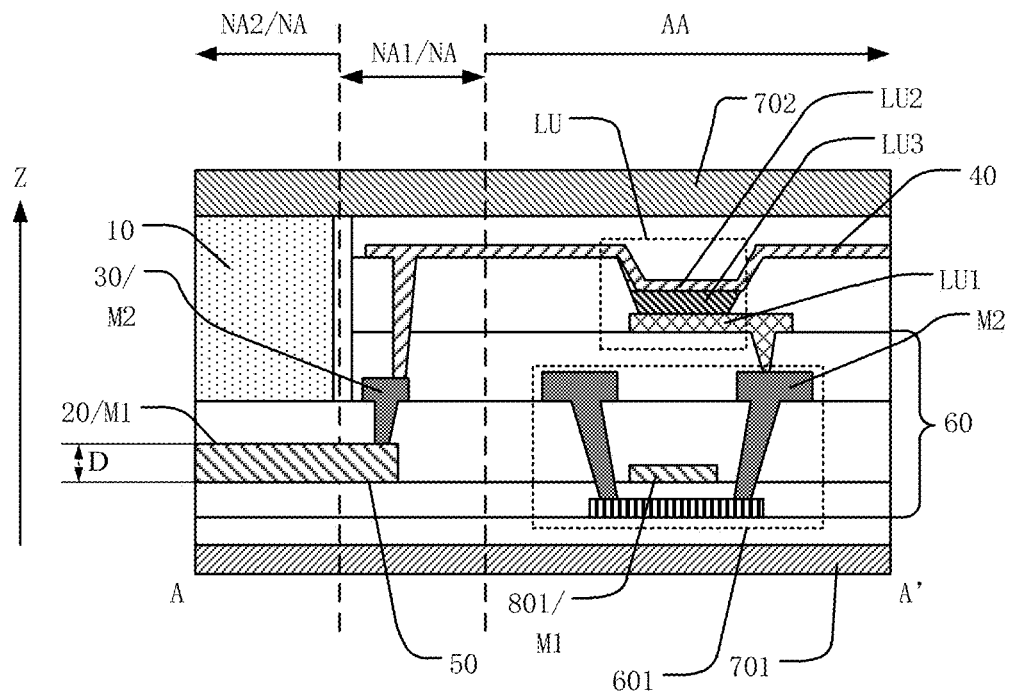
FIG. 2 illustrates AA' sectional view of an exemplary display panel in FIG. 1 consistent with disclosed embodiments of the present disclosure.

FIG. 1 illustrates a schematic top view of a display panel consistent with disclosed embodiments of the present disclosure, and FIG. 2 illustrates an AA' sectional view of the display panel in FIG. 1. To clearly illustrate the structure, a frame adhesive 10 and a padding metal 20 in FIG. 1 may be filled with a transparent color. Referring to FIG. 1 and FIG. 2, the display panel 000 may include a display region AA and a frame region NA (non-display region) surrounding the display region AA. The frame region NA may include a first region NA1 and a second region NA2 surrounding the first region NA1.

In addition, the display panel may include a frame adhesive 10 located in the second region NA2. Optionally, the material of the frame adhesive 10 may be a colloid, and the colloid may be cured by laser irradiation to achieve a sealing and fixing effect.

Moreover, the display panel may include a padding metal 20 located in the second region NA2. In a direction Z perpendicular to a plane where the display panel 000 is located, the padding metal 20 may at least partially overlap the frame adhesive 10.

Further, the display panel may include a cathode signal line 30. The cathode signal line 30 may be at least partially arranged around the display region AA, and the cathode signal line 30 may be located in the first region NA1.

The display region AA may include a cathode layer 40. Optionally, the cathode layer 40 may be disposed as an entire surface within the display region AA, and the cathode layer 40 may be connected to the cathode signal line 30.

The padding metal 20 may be connected to at least one connecting part 50. The connecting part 50 may be located on a side of the padding metal 20 adjacent to the first region NA1, and the connecting part 50 may be connected to the cathode signal line 30.

Specifically, the display panel 000 as an organic light-emitting display panel may be used as an example. The display principle may include that the anode and cathode of the light-emitting device are driven by a certain electric field; electrons and holes are injected from the cathode and anode to an electron transport layer and a hole transport layer, respectively; electrons and holes migrate to a light-emitting layer of the light-emitting device through the electron transport layer and hole transport layer, respectively, and meet in the light-emitting layer to form excitons and to excite light-emitting molecules; and when an appropriate voltage is applied, the holes in anode and the electrons in cathode may be combined in the light-emitting layer to produce the three primary colors of red, green and blue according to different formulas, which may constitute the basic color and form a display screen.

The display region AA of the display panel 000 may include a plurality of light-emitting units LU, and each light-emitting unit LU may include the above-disclosed light-emitting device (not illustrated). Optionally, the anodes LU1 of the light-emitting units LU within the range of the display region AA may form an independent anode structure, and the cathodes LU2 of a plurality of light-emitting units LU may be connected to form a cathode layer 40 as an entire-surface. Optionally, the cathode LU2 may include a plurality of independent cathode structures.

The cathode signal line 30 may be disposed in the first region NA2 of the frame region NA. The cathode signal line 30 may be arranged around at least a portion of the display region AA. The cathode signal line 30 may be connected to the cathode layer 40 in the display region AA, and may be configured to provide a cathode voltage signal required to drive the electric field for the cathode layer 40.

The display panel 000 may further include an array layer 60. The array layer 60 may be configured to provide a plurality of driving transistors 601. The driving transistor 601 may be electrically connected to the anode LU1 of the light-emitting unit LU, and may be configured to provide an anode voltage signal for the anode LU1 of each light-emitting unit LU. Therefore, a certain driving electric field may be generated between the anode LU1 and the cathode LU2 of the light-emitting device, to achieve the display function.

The frame region NA of the display panel 000 may include the first region NA1 and the second region NA2 surrounding the first region NA1. In other words, the second region NA2 may be located outside the first region NA1. The frame adhesive 10 and the padding metal 20 may be located in the second region NA2, and the cathode signal line 30 may be located in the first region NA1. The first region NA1 may be configured to set a peripheral driving circuit of the display panel 000, such as a gate driving circuit.

The display panel 000 may include a first substrate 701 and a second substrate 702 that are oppositely disposed. The frame adhesive 10 in the second region NA2 of the frame region NA may seal and support the first substrate 701 and the second substrate 702, to enable the light-emitting unit LU to be located in a closed cavity enclosed by the first substrate 701, the second substrate 702 and the frame adhesive 10. Therefore, external water, oxygen, etc., may be prevented from penetrating into the light-emitting device.

In the direction Z perpendicular to the plane where the display panel 000 is located, the padding metal 20 may at least partially overlap the frame adhesive 10. The padding metal 20 that at least partially overlaps the frame adhesive 10 may be capable of reflecting laser incident on the frame adhesive 10 in the laser-assisted glass frit encapsulation process. Therefore, the reflected laser may be reused to improve packaging efficiency. While performing encapsulation, the laser may be prevented from irradiating on the first region NA1 of the frame region NA and damaging the peripheral driving circuit in the first region NA1 (such as a power signal line, a cathode signal line, a gate driving circuit, etc., which may not be illustrated in the Figure).

Optionally, in addition to reflecting the laser during the encapsulation process, the padding metal 20 may have other functions, such as capacitance compensation and electrostatic discharge, etc. Because the padding metal 20 is made of a metal conductive material, the padding metal 20 may be formed in a same layer as any one or more metal layers in the display region AA of the display panel 000, which may facilitate to reduce the process difficulty and to improve the process efficiency. For illustrative purposes, FIG. 2 illustrates that the padding metal 20 is formed in a same process as a gate metal layer 801 of the array layer 60 as an example. Optionally, the connecting part 50 and the cathode signal line 30 may be formed in different layers, and the connecting part 50 may be connected to the cathode signal line 30 through a via.

The padding metal 20 may be connected with at least one connecting part 50, and the connecting part 50 may be located on the side of the padding metal 20 adjacent to the first region NA1. In other words, the connecting part 50 may be located on a side of the padding metal 20 adjacent to the display region AA, and the at least one connecting part 50 may be connected to the cathode signal line 30. Optionally, the connecting part 50 may be used as an extension structure of the padding metal 20 and may be formed in a same layer and in a same process as the padding metal 20. For illustrative purposes, the same filling pattern in the Figure may refer to that the connecting part 50 and the padding metal 20 are made in the same layer and made of a same material.

In addition to transmitting a cathode signal to the cathode, the cathode signal line 30 disposed around the display region AA may be featured with electrostatic protection function. The voltage signal of the cathode layer 40 provided by the cathode signal line 30 may often be a low (negative) voltage signal. With respect to the electrostatic ring of the ground signal, the cathode signal line 30 multiplexed as an electrostatic ring may have better anti-static effect. At the same time, because the cathode signal line 30 is connected to the cathode layer 40 disposed as an entire surface within the range of the display region AA, when static charge strikes the screen of the display panel 000, the generated static charge may quickly enter the cathode layer 40 disposed as an entire surface through the connecting part 50 connected to the padding metal 20 and the cathode signal line 30 connected to the connecting part 50. In other words, the static charge may be quickly dispersed and released after entering the screen body of the display panel 000, thereby facilitating to improve the electro-static discharge (ESD) capability of the display panel 000.

The cathode signal line 30 that is multiplexed as an electrostatic ring may be located on the side of the frame adhesive 10 adjacent to the display region AA. In other words, the padding metal 20 may overlap the cathode signal line 30 on the side of the frame adhesive 10 adjacent to the display region AA. Because the frame adhesive 10 has desired sealing performance for isolating water and oxygen, the cathode signal line 30 reused as the electrostatic ring and the connecting part 50 connecting the padding metal 20 and the cathode signal line 30 may be arranged inside the first region NA1, which may block the external water and oxygen, and avoid the phenomena of reducing the ESD performance due to corrosion of the electrostatic ring, thereby facilitating to improve the anti-static ability, and to improve the product yield and display quality.

The display panel 000 may use the cathode signal line 30 as the electrostatic ring. Therefore, an additional electrostatic ring may not need to be disposed in the frame region NA, and a pad for providing ground signal may not need to be disposed in the frame region NA of the display panel 000 for bonding a driving chip, which may facilitate to achieve the electrostatic protection effect, and at the same time, may facilitate to reduce the width of the frame region NA of the display panel 000, to achieve the narrow frame of the display panel.

It should be noted that the structures of the display region AA and the frame region NA of the display panel 000 in the present disclosure may not be limited to the illustrated structure, and may further include any other structure that is capable of achieving the display function. Details may refer to the structure of the display panel in the related technology, which may not be repeated herein. For illustrative purposes, FIG. 1 illustrates the padding metal 20 connecting to one connecting part 50 as an example. In specific implementation, a quantity of connecting parts 50 may be determined according to practical applications.

Figure 3:
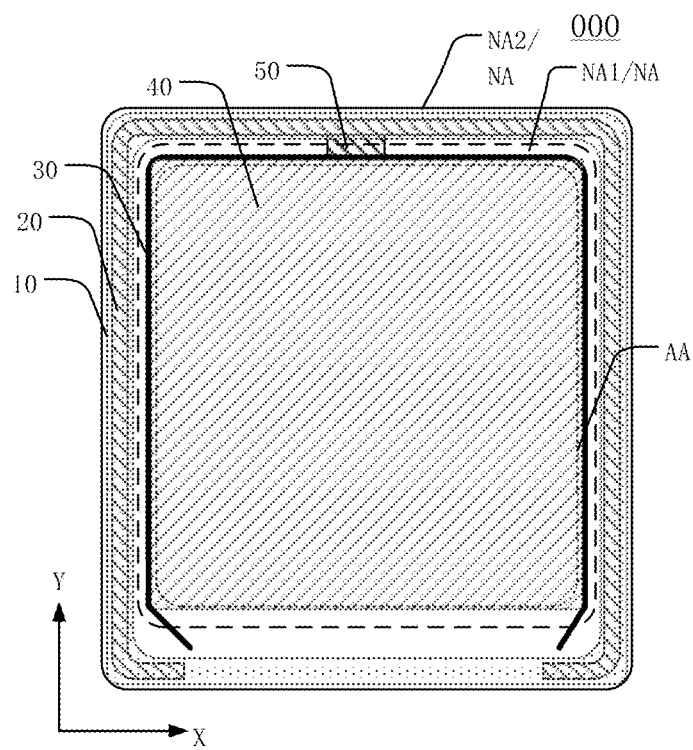
FIG. 3 illustrates a schematic top view of another exemplary display panel consistent with disclosed embodiments of the present disclosure.
Figure 4:
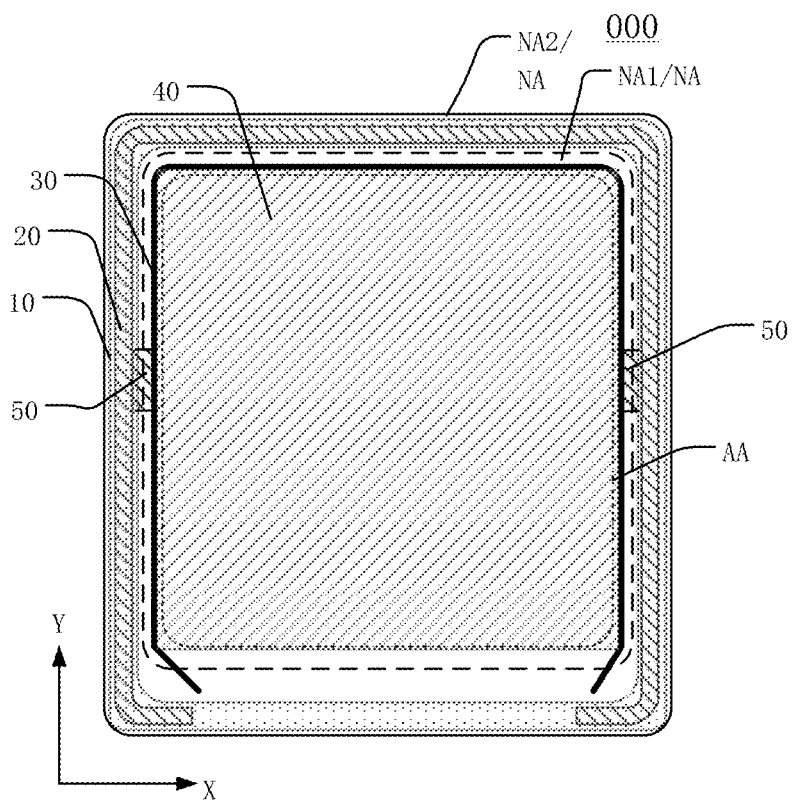
FIG. 4 illustrates a schematic top view of another exemplary display panel consistent with disclosed embodiments of the present disclosure.

FIG. 3 illustrates a schematic top view of another display panel consistent with disclosed embodiments of the present disclosure; and FIG. 4 illustrates a schematic top view of another display panel consistent with disclosed embodiments of the present disclosure. Optionally, referring to FIG. 3 and FIG. 4, the padding metal 20 may be a structure at least partially surrounding the display region AA. When the padding metal 20 is connected with one connecting part 50, the position where the connecting part 50 is disposed may be centered with respect to the shape of the padding metal 20 (as illustrated in the FIG. 3). When the padding metal 20 is connected with two connecting parts 50, the two connecting parts 50 may be symmetrically disposed with respect to the padding metal 20 (as illustrated in FIG. 4). Therefore, during the anti-static process, through the interconnected padding metal 20 and the connecting part 50, the cathode signal line 30 connected to the connecting part 50 and multiplexed as an electrostatic ring may substantially evenly disperse the static charge to the screen body of the display panel 000, which may facilitate to quickly achieve the electrostatic discharge effect.

Figure 5:
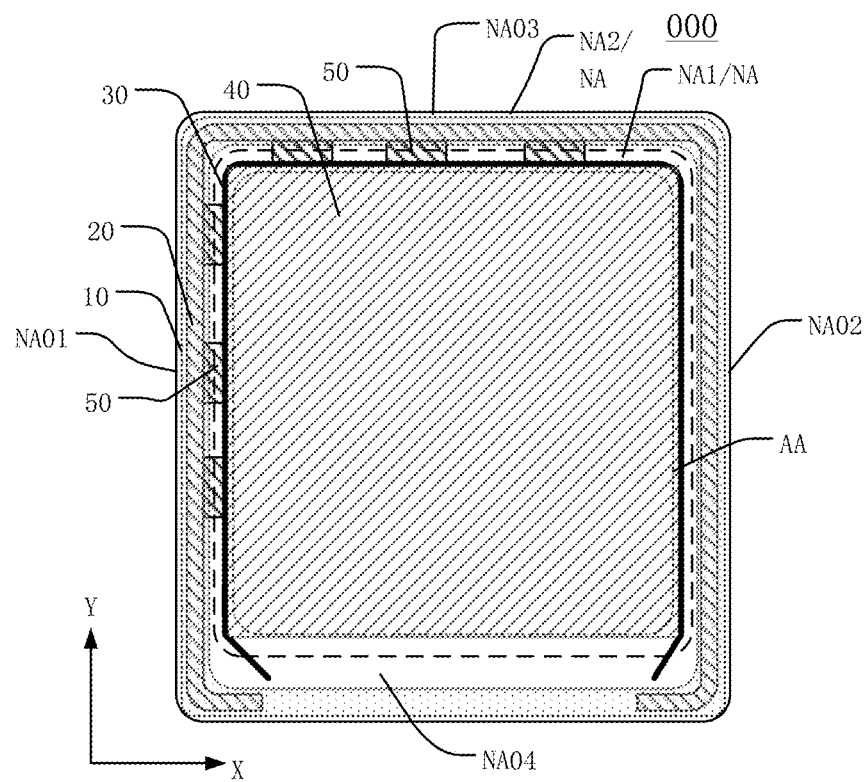
FIG. 5 illustrates a schematic top view of another exemplary display panel consistent with disclosed embodiments of the present disclosure.
Figure 6:
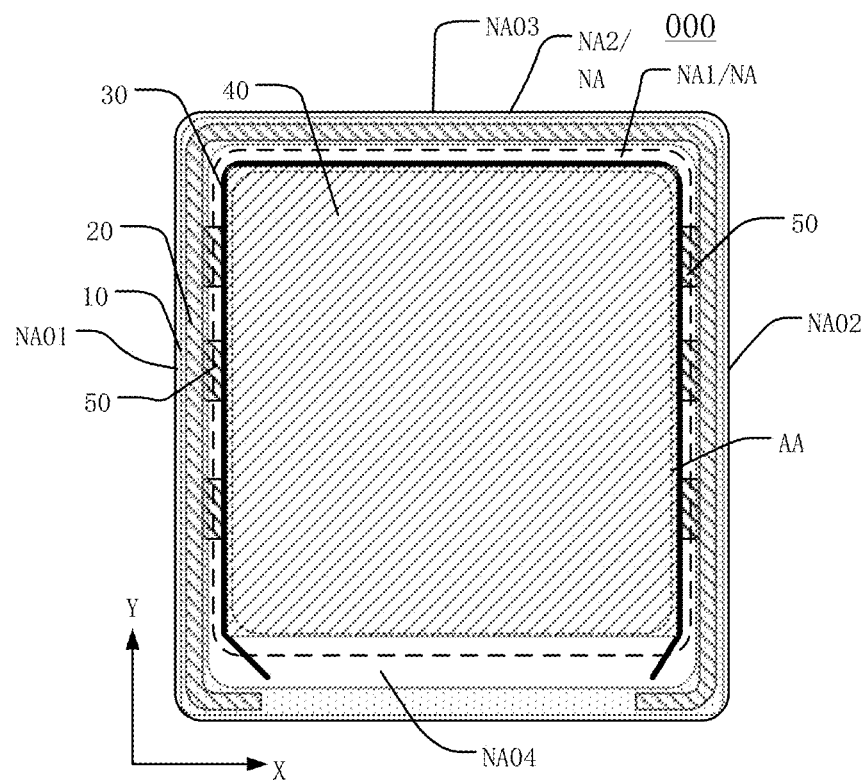
FIG. 6 illustrates a schematic top view of another exemplary display panel consistent with disclosed embodiments of the present disclosure.

FIG. 5 illustrates a schematic top view of another display panel consistent with disclosed embodiments of the present disclosure; and FIG. 6 illustrates a schematic top view of another display panel consistent with disclosed embodiments of the present disclosure. In certain embodiments, referring to FIG. 5 and FIG. 6, along a first direction X, the frame region NA may include a first sub-frame region NA01 and a second sub-frame region NA02 that are disposed on opposite sides of the display region AA. Along a second direction Y, the frame region NA may include a third sub-frame region NA03 and a fourth sub-frame region NA04 that are disposed on opposite sides of the display region AA. The first direction X may intersect the second direction Y. Optionally, the first direction X and the second direction Y may be perpendicular to each other in a plane parallel to the plane where the display panel 000 is located.

In one embodiment, the first sub-frame region NA01 and the third sub-frame region NA03 each may include one or more connecting parts 50. In another embodiment, the first sub-frame region NA01 and the second sub-frame region NA02 may include one or more connecting parts 50.

The present disclosure may explain that a quantity of connecting parts 50 connected to the padding metal 20 may be more than one. The frame region NA of the display panel 000 may include a plurality of sub-frame regions arranged around the display region AA. Optionally, along the first direction X, the frame region NA may include the first sub-frame region NA01 and the second sub-frame region NA02 that are disposed on opposite sides of the display region AA. Along the second direction Y, the frame region NA may include the third sub-frame region NA03 and the fourth sub-frame region NA04 that are disposed on opposite sides of the display region AA. In the plurality of sub-frame regions arranged around the display region AA, adjacent two sub-frame regions such as the first sub-frame region NA01 and the third sub-frame region NA03 may include multiple connecting parts 50 (as shown in FIG. 5), or two oppositely disposed sub-frame regions such as the first sub-frame region NA01 and the second sub-frame region NA02 may include multiple connecting parts 50 (as shown in FIG. 6).

In one embodiment, multiple connecting parts 50 may be connected to the padding metal 20, which may increase the overlapped area between the entire padding metal 20 and the cathode signal line 30, may facilitate the further rapid dispersion of static charge in the screen of the display panel 000, and may improve the electrostatic discharge capability of the display panel 000.

It should be noted that FIG. 5 and FIG. 6 merely illustrate the quantity of connecting parts 50 connected to the padding metal 20, which may not be limited to such number. In a specific implementation, the quantity of connecting parts 50 may be determined according to the size of the display panel and the requirements of static charge protection, which may not be specifically limited herein.

Figure 7:
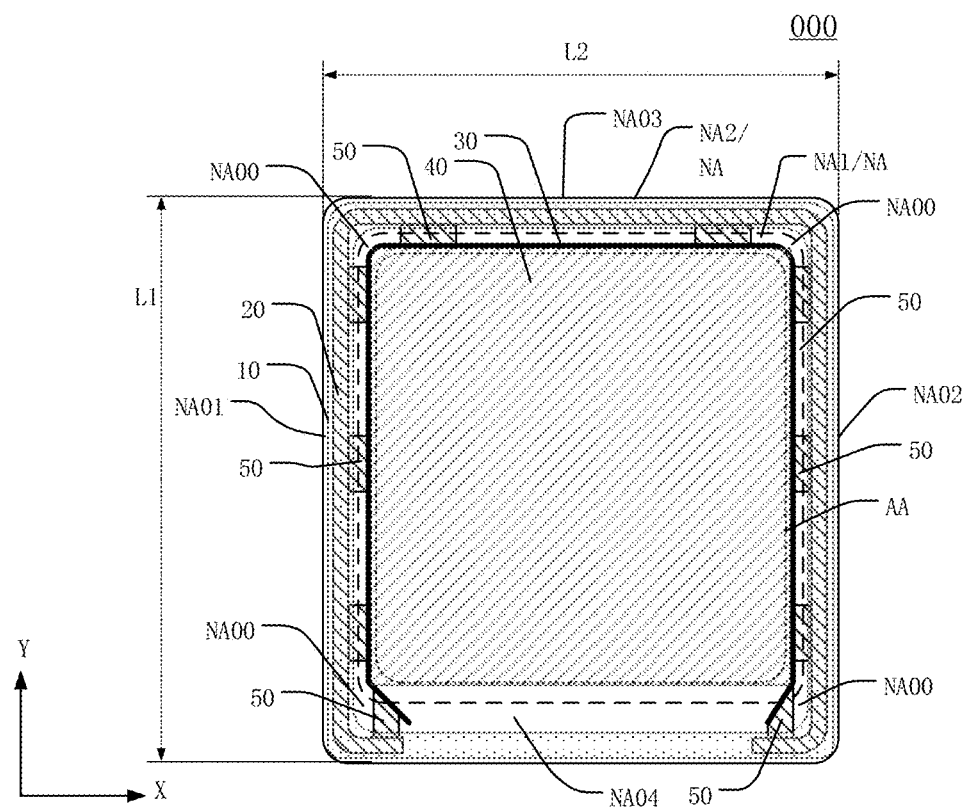
FIG. 7 illustrates a schematic top view of another exemplary display panel consistent with disclosed embodiments of the present disclosure.

FIG. 7 illustrates a schematic top view of another display panel consistent with disclosed embodiments of the present disclosure. In certain embodiments, referring to FIG. 7, the first sub-frame region NA01, the second sub-frame region NA02, the third sub-frame region NA03, and the fourth sub-frame region NA04 of the frame region NA of the display panel 000 each may include one or more connecting parts 50.

The present disclosure may explain that the sub-frame regions of the frame region NA of the display panel 000 may be disposed with the connecting part 50, to further increase the quantity of the connecting parts 50 connected to the padding metal 20. Therefore, the area of the connecting parts 50 connected to the cathode signal line 30 may be substantially large, which may reduce the sudden change in resistance, may further enhance the electrostatic discharge capability, may further quickly and uniformly disperse the static charge in the screen of the display panel 000, and may facilitate to further improve the electrostatic discharge capability of the display panel 000.

It should be noted that the multiple connecting parts 50 may have a same or different size, and may have a same or different shape. As long as the multiple connecting parts 50 are capable of being connected to the cathode signal line 30 while being connected to the padding metal 20, which may not be limited by the present disclosure.

Figure 8:
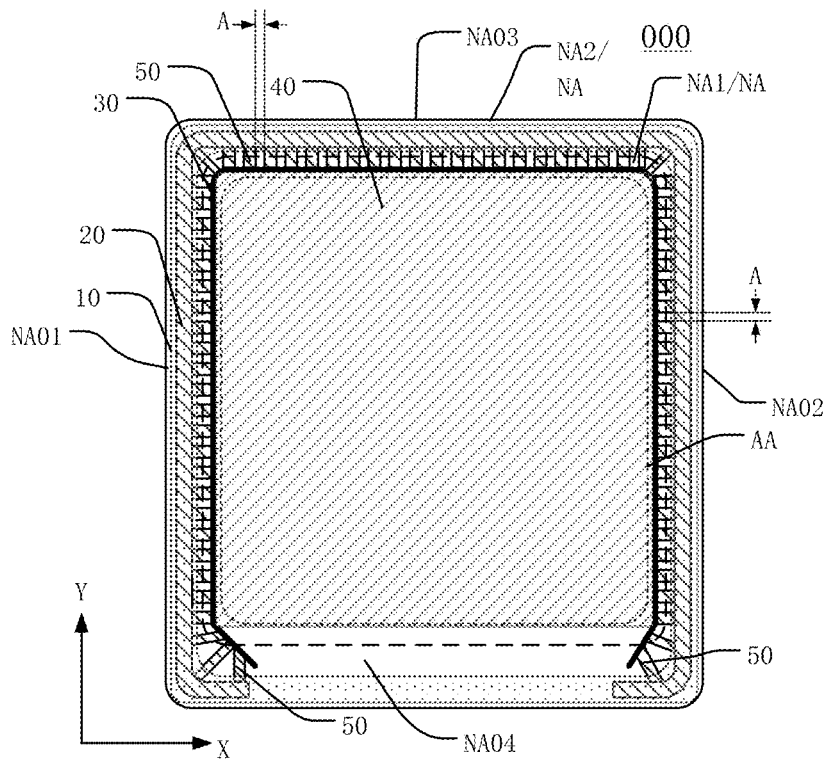
FIG. 8 illustrates a schematic top view of another exemplary display panel consistent with disclosed embodiments of the present disclosure.

FIG. 8 illustrates a schematic top view of another display panel consistent with disclosed embodiments of the present disclosure. In certain embodiments, referring to FIG. 8, a distance between adjacent two connecting parts 50 is A, where 3 μm≤A≤100 μm.

The present disclosure illustrates that the connecting parts 50 connected to the padding metal 20 may be a structure densely arranged around the padding metal 20. Along the first direction X, the distance between adjacent two connecting parts 50 is A, and along the second direction Y, a distance between adjacent two connecting parts 50 is also A, where the value of A may be substantially small. Therefore, a large number of connecting parts 50 with a substantially small area may be formed to be densely arranged surrounding the side of the padding metal 20 adjacent to the first region NA1. While being connected to the padding metal 20, the connecting parts 50 may be connected to the cathode signal line 30, which may be equivalent to setting a lot of densely packed jagged connecting parts 50 on the side of the padding metal 20 adjacent to the first region NA1.

Because each connecting part 50 is substantially small and the connecting parts 50 are evenly arranged around the display region AA, even if the static charge brings damage, the damage to the padding metal 20 may be substantially weak. Therefore, the phenomena of encapsulation failure due to extremely high damage may be prevented, which may facilitate to improve the electro-static protection capability of the display panel 000.

In certain embodiments, referring to FIG. 7, a length L1 of the first sub-frame region NA01 of the display panel 000 in the second direction Y may be greater than a length L2 of the third sub-frame region NA03 in the first direction X. The quantity of connecting parts 50 in the first sub-frame region NA01 may be greater than the quantity of connecting parts 50 in the third sub-frame region NA03.

The present disclosure may explain that the display panel 000 may have a long side and a short side. When the length L1 of the first sub-frame region NA01 in the second direction Y is greater than the length L2 of the third sub-frame region NA03 in the first direction X, the quantity of connecting parts 50 in the first sub-frame region NA01 may be set to be greater than the quantity of connecting parts 50 in the third sub-frame region NA03. Therefore, the quantity of connecting parts 50 in the first sub-frame region NA01 corresponding to the long side may be set substantially large, which may facilitate to reasonably arrange the connecting parts 50, such that static charge may be quickly and evenly dispersed in the screen, and the electrostatic discharge capability of the display panel 000 may be further improved.

In certain embodiments, referring to FIG. 7, the display panel 000 may include a plurality of corners R, and the frame region NA where the corner R is located may refer to a corner sub-frame region NA00. In the direction Z perpendicular to the plane where the display panel 000 is located, the connecting part 50 may not overlap the corner sub-frame region NA00.

The present disclosure may explain that the display panel 000 may be a structure with multiple corners R, such as a square panel (as shown in FIG. 7) or an irregular-shaped panel with notches. The frame region NA where the corner R is located may refer to the corner sub-frame region NA00. In the direction Z perpendicular to the plane where the display panel 000 is located, the connecting part 50 may not overlap the corner sub-frame region NA00. In other words, the location of the connecting part 50 connected to the padding metal 20 provided in the present disclosure may avoid the corner sub-frame region NA00 corresponding to the corner R. Because the position of the corner R of the display panel 000 may often be likely to be impacted by external forces (e.g., anti-drop test or normal use), the location of the connecting part 50 in the present disclosure may avoid the corner sub-frame region NA00, which may avoid increasing the burden on position of the corner R, and at the same time, may prevent the connecting part 50 from being easily damaged by external impact at the position of corner R, and may be prevented from affecting the electrostatic discharge effect. The corner sub-frame region NA00 may often be a top corner of the display panel.

Figure 9:
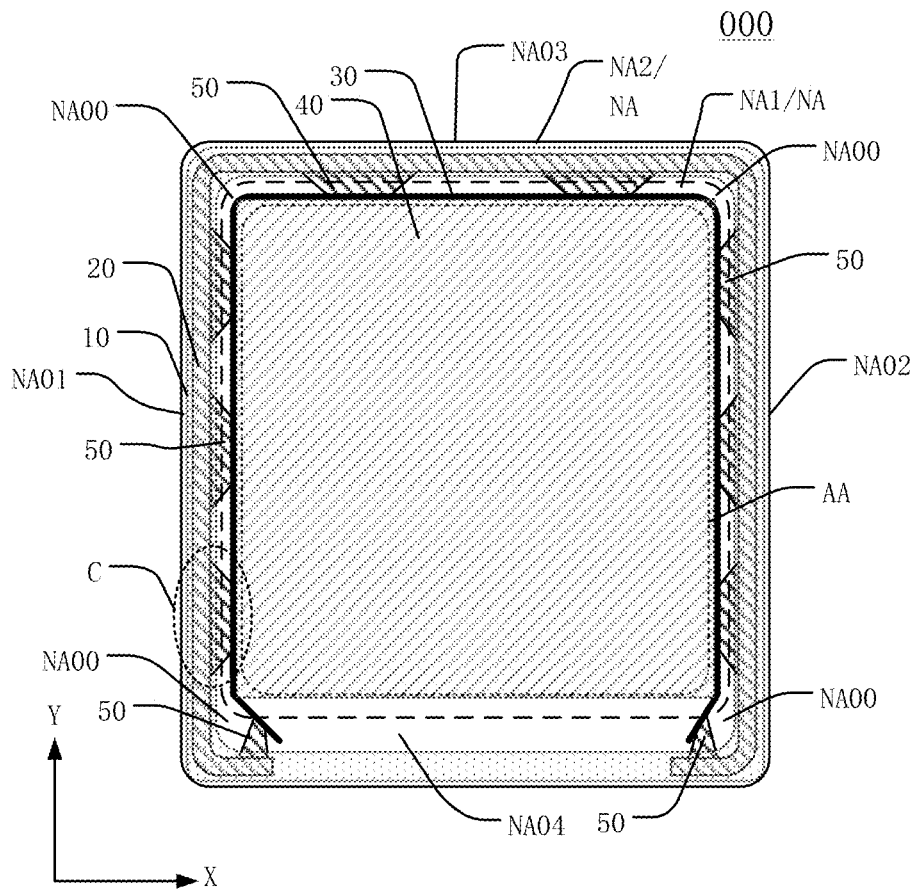
FIG. 9 illustrates a schematic top view of another exemplary display panel consistent with disclosed embodiments of the present disclosure.
Figure 10:
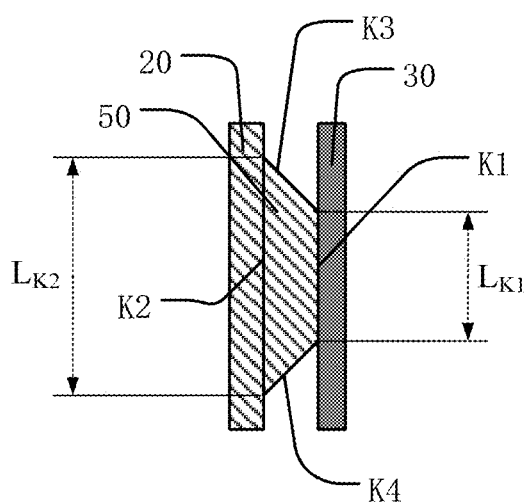
FIG. 10 illustrates a schematic local zoom-in top-view of a region C of another exemplary display panel in FIG. 9 consistent with disclosed embodiments of the present disclosure.
Figure 11:
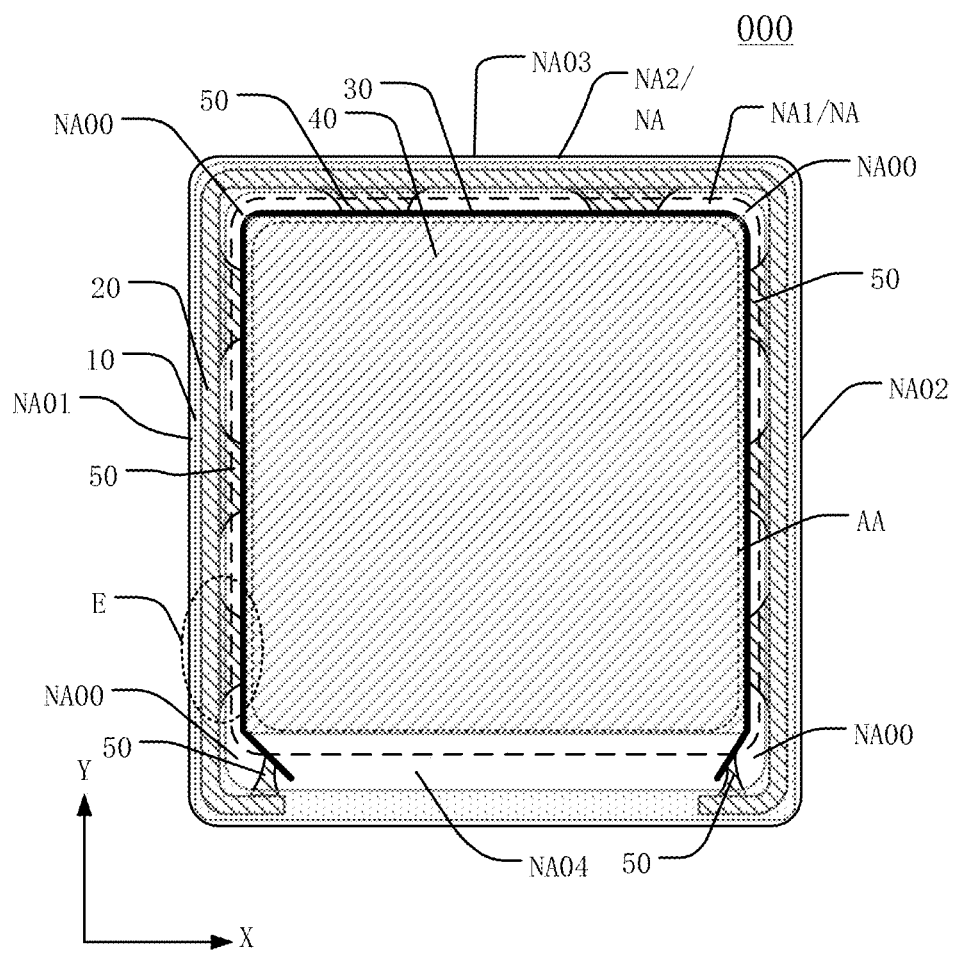
FIG. 11 illustrates a schematic top view of another exemplary display panel consistent with disclosed embodiments of the present disclosure.
Figure 12:
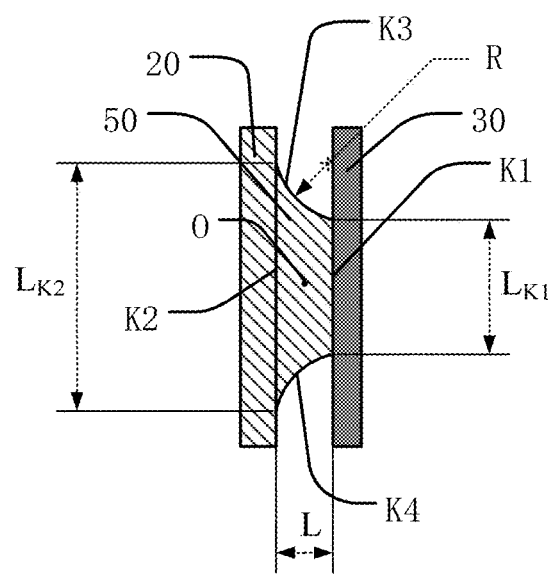
FIG. 12 illustrates a schematic local zoom-in top-view of a region E of another exemplary display panel in FIG. 11 consistent with disclosed embodiments of the present disclosure.
Figure 13:
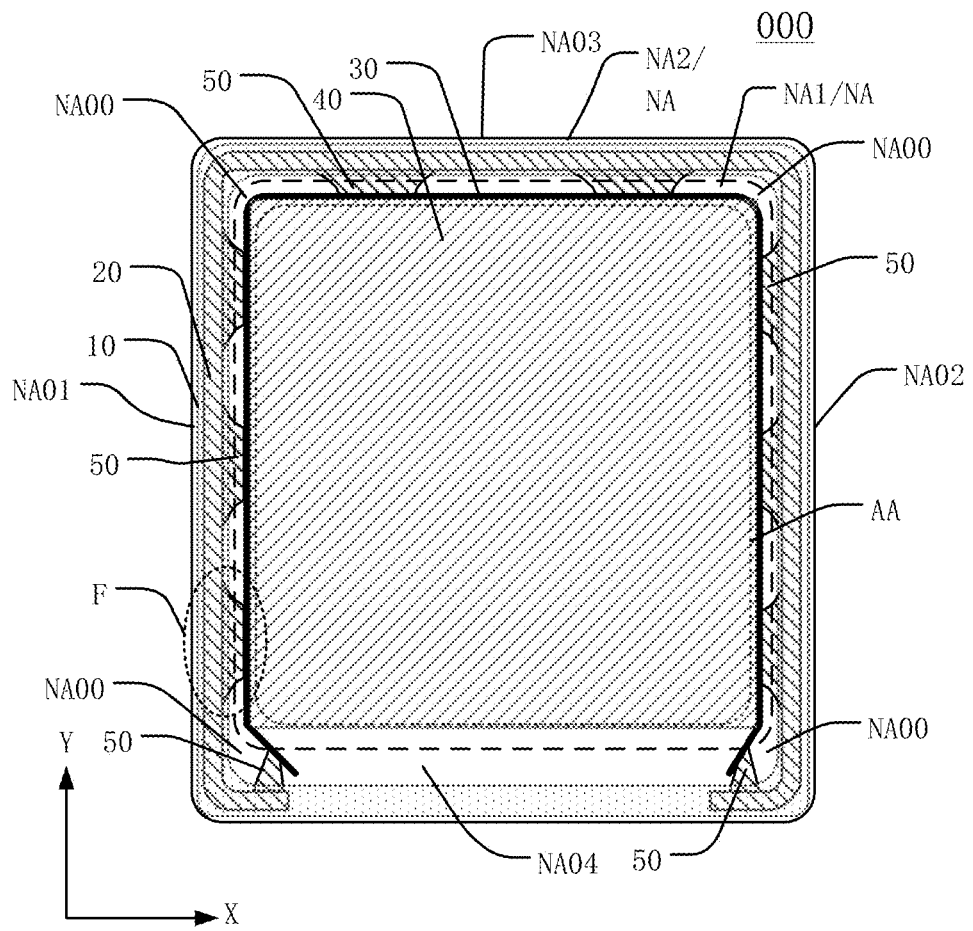
FIG. 13 illustrates a schematic top view of another exemplary display panel consistent with disclosed embodiments of the present disclosure.
Figure 14:
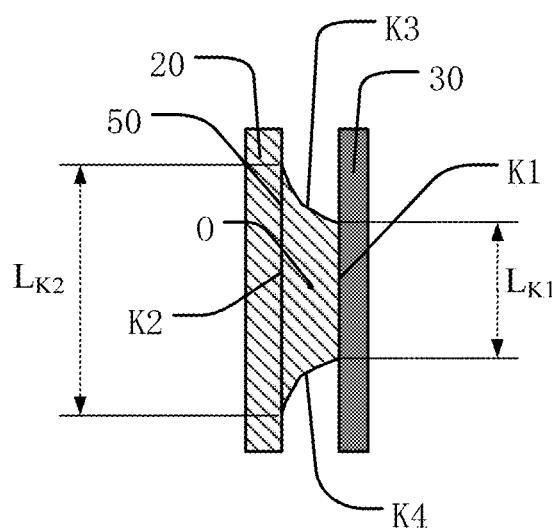
FIG. 14 illustrates a schematic local zoom-in top-view of a region F of another exemplary display panel in FIG. 13 consistent with disclosed embodiments of the present disclosure.

FIG. 9 illustrates a schematic top view of another display panel consistent with disclosed embodiments of the present disclosure; and FIG. 10 illustrates a schematic local zoom-in top-view of a region C of the display panel in FIG. 9. FIG. 11 illustrates a schematic top view of another display panel consistent with disclosed embodiments of the present disclosure; and FIG. 12 illustrates a schematic local zoom-in top-view of a region E of the display panel in FIG. 11. FIG. 13 illustrates a schematic top view of another display panel consistent with disclosed embodiments of the present disclosure; and FIG. 14 illustrates a schematic local zoom-in top-view of a region F of the display panel in FIG. 13.

In certain embodiments, referring to FIGS. 9-14, a shape of an orthographic projection of the connecting part disposed in the display panel 000 on the plane where the display panel 000 is located may be a first graph. The first graph may include a first edge line K1 adjacent to the display region AA, a second edge line K2 far away from the display region AA, a third edge line K3 and a fourth edge line K4 connecting the first edge line K1 and the second edge line K2. The first edge line K1 and the second edge line K2 may be oppositely arranged, and the third edge line K3 and the fourth edge line K4 may be oppositely arranged. A length $L_{K1}$ of the first edge line K1 may be less than a length $L_{K2}$ of the second edge line K2.

The present disclosure may explain that the shape of the orthographic projection of the connecting part 50 connected with the padding metal 20 on the plane where the display panel 000 is located may be the first graph. In practical production and application, when the static charge strikes screen body of the display panel, the structure enclosed by the frame adhesive 10 and the padding metal 20 may be damaged, thereby causing the encapsulation failure. For example, under a substantially high impact voltage, the padding metal 20 may be easily damaged at some resistance mutation positions to cause the encapsulation failure. The static charge may be released at the resistance mutation positions, such that the electrostatic protection of the display panel may have a certain bottleneck.

In one embodiment, the shape of the orthographic projection of the connecting part on the plane where the display panel 000 is located may include the first edge line K1 adjacent to the display region AA, the second edge line K2 far away from the display region AA, and the third edge line K3 and the fourth edge line K4 connecting the first edge line K1 and the second edge line K2. The first edge line K1 and the second edge line K2 may be oppositely arranged, and the third edge line K3 and the fourth edge line K4 may be oppositely arranged. The length $L_{K1}$ of the first edge line K1 may be less than the length $L_{K2}$ of the second edge line K2. In other words, the side of the connecting part 50 adjacent to the padding metal 20 (the side connected to the padding metal 20) may be substantially long, and the side of the connecting part 50 adjacent to the display region AA may be substantially short. Therefore, the connecting part 50 may have a structure whose length becomes shorter and shorter along a direction pointing to the display region AA from the padding metal 20, and, thus, charges may be prevented from being accumulated at the sharp or right-angle positions of the connecting part 50.

The resistance mutation may cause the connecting part 50 or the padding metal 20 connected to the connecting part 50 to be damaged at such position by static charge, which may cause the encapsulation failure. Therefore, in one embodiment, the shape of the orthographic projection of the connecting part 50 on the plane where the display panel 000 is located may be designed as the first graph, which may facilitate to reduce possibility of the connecting part 50 or the padding metal 20 connected to the connecting part being damaged at the resistance mutation position by static charge, thereby improving the production yield and display quality.

In the present disclosure, the shape of the first graph may not be specifically limited, and may be a trapezoid, a rounded trapezoid (the connection between the padding metal and the connecting part 50 may be designed to be a smooth rounded corner), or any other structure (as shown in the FIGS. 9-14). As long as the connecting part 50 has a length getting shorter and shorter along a direction pointing to the display region AA from the padding metal 20, and the connecting part 50 does not have resistance modulation position caused by sharp or right-angled graph, the shape of the connecting part 50 may be designed according to practical applications.

In certain embodiments, referring to FIG. 9 and FIG. 10, the orthographic projection of the connecting part 50 on the plane where the display panel 000 is located may have a trapezoidal shape, and the substantially long second edge line K2 and the substantially short first edge line K1 may be directly connected by oblique lines, to form the third edge line K3 and the fourth edge line K4 having an oblique linear structure. In other words, the side of the connecting part 50 adjacent to the padding metal 20 (the side connected with the padding metal 20) may be substantially long, and the side of the connecting part 50 adjacent to the display region AA may be substantially short. Therefore, the connecting part 50 may have a structure whose length becomes shorter and shorter along the direction pointing to the display region AA from the padding metal 20, and the connecting part 50 may be prevented from having a sharp or right-angled graph. Thus, charges may be prevented from being accumulated at the sharp or right-angled position of the connecting part 50. The resistance mutation may cause the connecting part 50 or the padding metal 20 connected to the connecting part 50 to be damaged at such position by static charge, which may cause the encapsulation failure. Therefore, in the present disclosure, the production yield and display quality may be improved.

In certain embodiments, referring to FIG. 11 and FIG. 12, the shape of the orthographic projection of the connecting part 50 on the plane where the display panel 000 is located may be a first graph. Both the third edge line K3 and the fourth edge line K4 of the first graph may be arc lines. The substantially long second edge line K2 and the substantially short first edge line K1 may be directly connected by the arc lines. The first graph may include a geometric center point O. The third edge line K3 may be recessed toward a direction approaching to the geometric center point O, and the fourth edge line K4 may be recessed toward a direction approaching to the geometric center point O. The formed third edge line K3 and the fourth edge line K4 having the arc line structure may enable the connection between the padding metal 20 and the connecting part 50 to have a smooth rounded structure.

In other words, the side of the connecting part 50 adjacent to the padding metal 20 (the side connected with the padding metal 20) may be substantially long, and the side of the connecting part 50 adjacent to the display region AA may be substantially short. Therefore, the connecting part 50 may have a structure whose length becomes shorter and shorter along the direction pointing to the display region AA from the padding metal 20. Thus, charges may be prevented from being accumulated at the sharp or right-angled position of the connecting part 50. The resistance mutation may cause the connecting part 50 or the padding metal 20 connected to the connecting part 50 to be damaged at such position by static charge, which may cause the encapsulation failure. Therefore, in the present disclosure, the production yield and display quality may be improved.

Optionally, referring to FIG. 11 and FIG. 12, a distance between the first edge line K1 and the second edge line K2 is L, and a radius of a circle where the arc line of the third edge line K3 (or the fourth edge line K4) is located is R, where R≥½L. In one embodiment, both the third edge line K3 and the fourth edge line K4 of the first graph may be configured as arc lines, and the radius R of the circle where the arc lines of the third edge line K3 (or the fourth edge line K4) is located may be greater than or equal to the distance L between the first edge line K1 and the second edge line K2. Therefore, the connecting part 50 may be prevented from having a sharp or right-angled structure with a resistance mutation, and at the same time, the manufacturing process may be facilitated.

In certain embodiments, referring to FIG. 13 and FIG. 14, the shape of the orthographic projection of the connecting part 50 on the plane where the display panel 000 is located may be the first graph. The third edge line K3 and the fourth edge line K4 of the first graph may have a polyline structure including a plurality of sub-line segments. The first graph may include a geometric center point O. The third edge line K3 may be recessed toward a direction approaching to the geometric center point O, and the fourth edge line K4 may be recessed toward a direction approaching to the geometric center point O, to form the third edge line K3 and the fourth edge line K4 with the polyline structure including the plurality of sub-line segments.

In other words, the side of the connecting part 50 adjacent to the padding metal 20 (the side connected with the padding metal 20) may be substantially long, and the side of the connecting part 50 adjacent to the display region AA may be substantially short. Therefore, the connecting part 50 may have a structure whose length becomes shorter and shorter along the direction pointing to the display region AA from the padding metal 20. Thus, charges may be prevented from being accumulated at the sharp or right-angled position of the connecting part 50. The resistance mutation may cause the connecting part 50 or the padding metal 20 connected to the connecting part 50 to be damaged at such position by static charge, which may cause the encapsulation failure. Therefore, in the present disclosure, the production yield and display quality may be improved.

In certain embodiments, referring to FIGS. 9-14, the length $L_{K1}$ of the first edge line K1 may be greater than or equal to 600 m. The present disclosure may further explain that the shape of the orthographic projection of the connecting part 50 on the plane where the display panel 000 is located may be the first graph, and the length $L_{K1}$ of the substantially short first edge line K1 of the first graph adjacent to the display region AA may be greater than or equal to 600 m. Therefore, the connecting part 50 may have a certain length along an extension direction of the first edge line K1, the reliability of the connecting part 50 may be enhanced, and the connecting part 50 may be prevented from being too short to be easily damaged or broken by static charge, which may destroy the electrostatic discharge route.

In certain embodiments, referring to FIG. 1 and FIG. 2, along the direction Z perpendicular to the plane where the display panel 000 is located, a thickness of the padding metal 20 is D, where 200 nm D 300 nm.

The present disclosure may exemplarily illustrate that along the direction Z perpendicular to the plane where the display panel 000 is located, the thickness of the padding metal 20 may set to be substantially thick. The thickness of the padding metal 20 is D, and 200 nm≤D≤300 nm (when the padding metal 20 is made in a same layer and made of a same material as the gate metal layer 801, the thickness of the padding metal is often approximately 200 nm). Therefore, charges may be prevented from being accumulated at the sharp or right-angled position of the connecting part 50. The resistance mutation may cause the connecting part 50 or the padding metal 20 connected to the connecting part 50 to be damaged at such position by static charge, which may cause the encapsulation failure. At the same time, by increasing the thickness of the padding metal 20, the resistance of the padding metal 20 may be reduced, which may facilitate to improve the dispersion capability of static charge to further enhance the electrostatic discharge ability.

Optionally, the padding metal 20 may be connected to the connecting part 50, and the connecting part 50 may be made in a same layer and made of a same material as the padding metal 20. In other words, along the direction Z perpendicular to the plane where the display panel 000 is located, the thickness of the padding metal 20 and the connecting part 50 is D, where 200 nm≤D≤300 nm. Therefore, the resistance of the connecting part 50 connecting the padding metal 20 and the cathode signal line 30 may be further reduced, and the capability of dispersing static charge into the screen may be further enhanced.

Referring to FIG. 1 and FIG. 2, because the padding metal 20 is made of a metal conductive material, the padding metal 20 may be made in a same layer as any one or more layers of metal in the display region AA of the display panel 000. For illustrative purposes, FIG. 2 may illustrate that the padding metal 20 is made in a same layer as the gate metal layer 801 of the array layer 60 as an example. Optionally, when the thickness D of the padding metal 20 needs to increase, the padding metal 20 may be made in a same layer as any metal layer in the display region AA, and merely the thickness of the padding metal 20 needs to be additionally increased during production.

Figure 15:
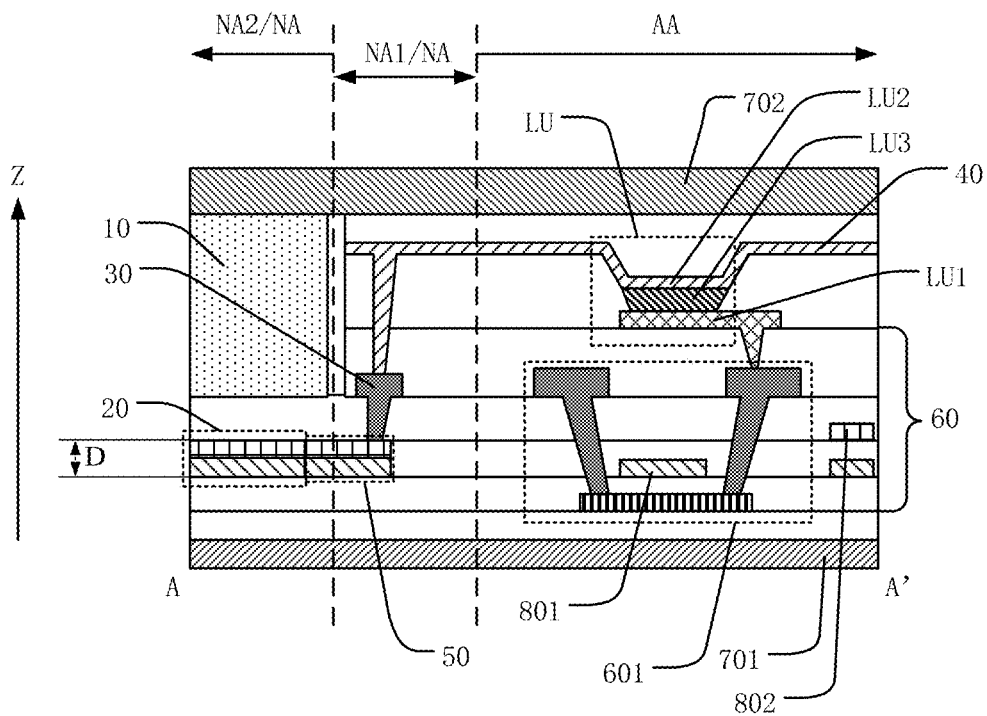
FIG. 15 illustrates a AA' sectional view of another exemplary display panel in FIG. 1 consistent with disclosed embodiments of the present disclosure.

FIG. 15 illustrates an AA' sectional view of the display panel in FIG. 1. Optionally, referring to FIG. 15, the padding metal 20 may be made of a same material as the plurality of metal layers in the display region AA. For example, the display region AA may include a capacitor metal layer 802, which may be configured to form a storage capacitor of the display panel. The padding metal 20 may be made of two metal layers formed in same layers as the capacitor metal layer 802 and the gate metal layer 801 in the display region AA, respectively. In the second region NA2 of the frame region NA, the two metal layers extended from the capacitor metal layer 802 and the gate metal layer 801 of the display region AA may be stacked together to form the substantially thick padding metal 20. Optionally, the thickness of the connecting part 50 may increase accordingly, thereby reducing the resistance of the padding metal 20 and the connecting part 50, reducing the resistance difference with the cathode signal line 30, improving the capability of dispersing static charge in the screen, and further improving the electrostatic discharge capability.

Figure 16:
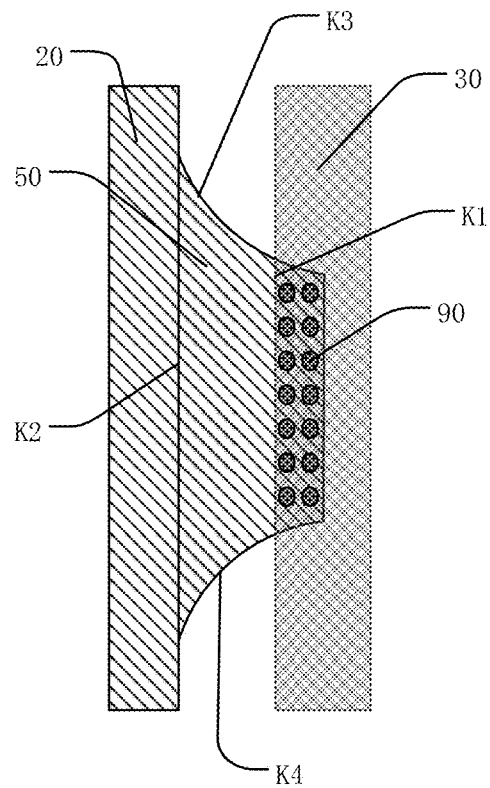
FIG. 16 illustrates a schematic local zoom-in top-view of a region E of another exemplary display panel in FIG. 11 consistent with disclosed embodiments of the present disclosure.

FIG. 16 illustrates a schematic local zoom-in top-view of a region E of the display panel in FIG. 11. To clearly illustrate a plurality of vias, the cathode signal line 30 in FIG. 16 may be filled with a transparent color. In certain embodiments, referring to FIG. 11 and FIG. 16, the connecting part 50 may be connected to the cathode signal line 30 through the plurality of vias 90.

In the present disclosure, the connecting part 50 may be formed in a layer different from the cathode signal line 30, and the connection between the connecting part 50 and the cathode signal line 30 may be achieved by the plurality of vias 90. Within a same overlap area, as many as possible vias 90 may be configured to connect the connecting part 50 and the cathode signal line 30. The plurality of vias 90 may form a parallel structure to connect the connecting part 50 and the cathode signal line 30, which may reduce the connection resistance between the connecting part 50 and the cathode signal line 30. Further, the connection between different layers in the display region AA may often be a small-hole etching connection, such that the connection between the connecting part 50 and the cathode signal line 30 through the plurality of small vias 90 may facilitate process stability.

In certain embodiments, referring to FIG. 1 and FIG. 2, the display panel 000 in the present disclosure may be an organic light-emitting display panel. The display panel 000 may include a first substrate 701 and a second substrate 702 that are oppositely disposed. The frame adhesive 10 may be located between the first substrate 701 and the second substrate 702. The padding metal 20 may be configured to reflect laser and melt the frame adhesive 10. The frame adhesive 10 may be frit, which may become a molten state after absorbing laser, thereby achieving a desired adhesion effect and a desired sealing effect.

The display panel 000 in the present disclosure may include the first substrate 701 and the second substrate 702 that are oppositely disposed. The frame adhesive 10 located in the second region NA2 of the frame region NA may seal and support the first substrate 701 and the second substrate 702, such that the light-emitting unit LU may be located in the closed cavity enclosed by the first substrate 701, the second substrate 702 and the frame adhesive 10. Therefore, external water, oxygen, etc., may be prevented from penetrating into the light-emitting device.

The padding metal 20 may be configured to reflect laser incident on the frame adhesive 10 during the laser-assistant frit encapsulation process, such that the reflected laser may be reused for encapsulation. While melting the frame adhesive 10, the laser may be prevented from irradiating on the first region NA1 of the frame region NA to damage the peripheral driving circuit in the first region NA1.

In certain embodiments, referring to FIG. 1 and FIG. 2, the display panel 000 may include a plurality of scan lines extended along the first direction X and a plurality of data lines extended along the second direction Y. The array layer 60 on the first substrate 701 may include a first metal layer M1 and a second metal layer M2. The scan lines and the padding metal 20 may be located on the first metal layer M1, and the data lines and the cathode signal line 30 may be located on the second metal layer M2.

The present disclosure may explain that the array layer 60 on the first substrate 701 of the display panel 000 may include the first metal layer M1 and the second metal layer M2. The first metal layer M1 in the display region AA may be configured to form scan lines, and the second metal layer M2 in the display region AA may be configured to form the data lines. The second metal layer M2 configured to form the data lines in the display panel 000 may often be a substantially thick film layer, which may enable the data line to have desired conductive performance and substantially high stability, and to be less likely to be disturbed by any other electrical fluctuation. Therefore, in the present disclosure, the cathode signal line 30 multiplexed as an electrostatic ring and the data lines on the second metal layer M2 may be formed in a same layer, a same process, and made of a same material, which may facilitate to reduce the impedance of the cathode signal line 30 and enhance the electrostatic discharge capability.

Figure 17:
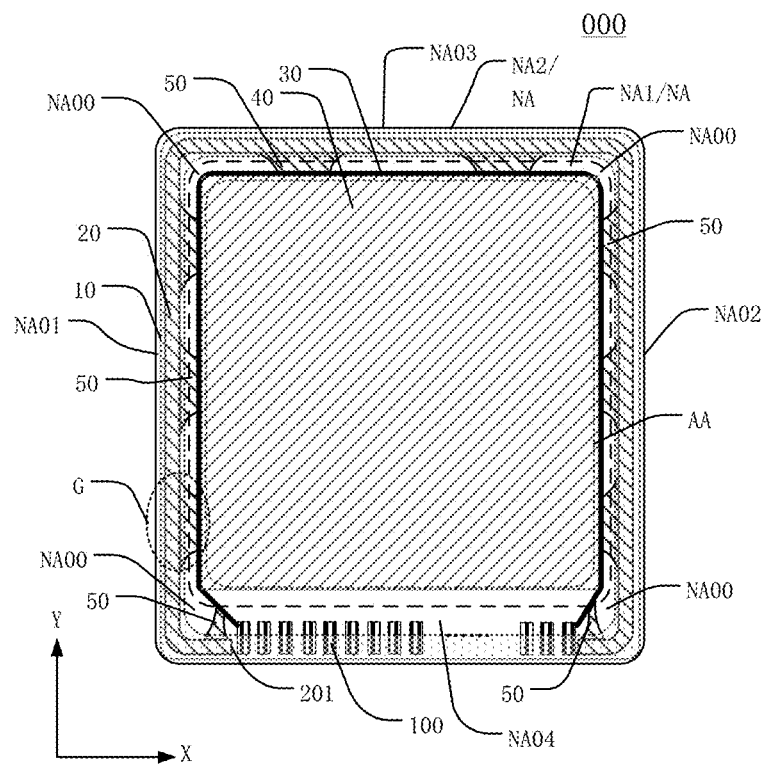
FIG. 17 illustrates a schematic top view of another exemplary display panel consistent with disclosed embodiments of the present disclosure.

FIG. 17 illustrates a schematic top view of another display panel consistent with disclosed embodiments of the present disclosure. In certain embodiments, referring to FIG. 17, the fourth sub-frame region NA04 of the frame region NA of the display panel 000 may be a bonding region, and may include a plurality of conductive pads 100. The padding metal 20 may be a ring structure containing a notch 201, and the notch 201 may be located in the fourth sub-frame region NA04.

The present disclosure may explain that the padding metal 20 may be a structure arranged around at least a portion of the display region AA. In other words, the padding metal 20 may be a ring structure containing the notch 201, and the notch 201 may be located in the fourth sub-frame region NA04. The fourth sub-frame region NA04 may be the bonding region, and may include the plurality of conductive pads 100. The plurality of conductive pads 100 may be configured to bond the driving chip or a flexible circuit board, to provide a driving signal for displaying for the display panel. For example, the cathode signal line 30 may be connected to a conductive pad 100, and a signal may be inputted to the conductive pad 100 to provide a display driving signal for the cathode signal line 30. In one embodiment, the padding metal 20 with the notch 201 may be disposed in the fourth sub-frame region NA04, which may provide space for bonding the driving chip or the flexible circuit board, and at the same time, the arrangement of the padding metal 20 may avoid the conductive pad of the bonding region, which may facilitate to simplify the layout of the conductive pads 100.

Figure 18:
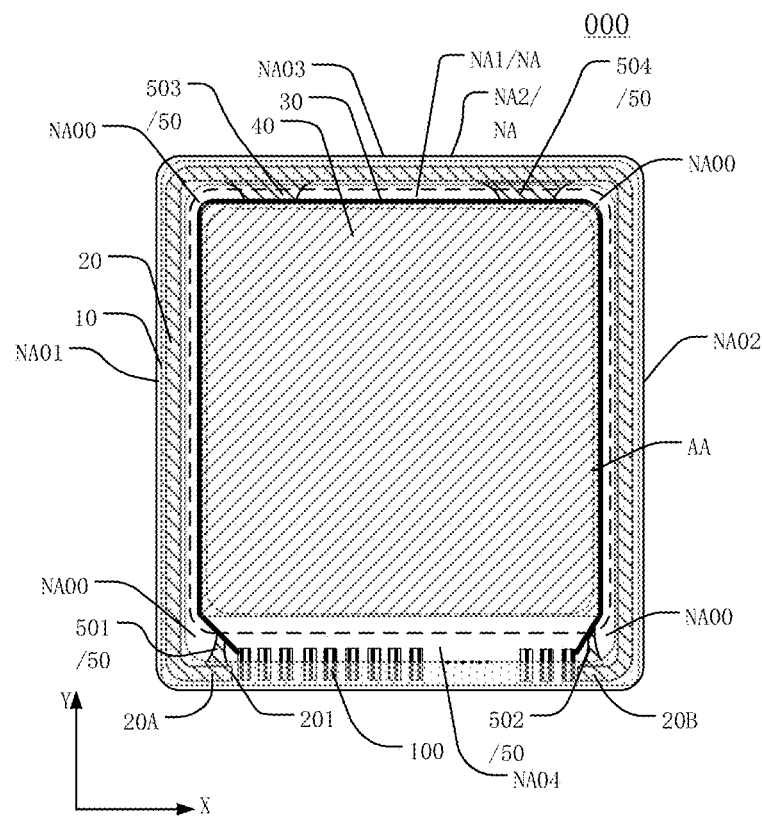
FIG. 18 illustrates a schematic top view of another exemplary display panel consistent with disclosed embodiments of the present disclosure.

FIG. 18 illustrates a schematic top view of another display panel consistent with disclosed embodiments of the present disclosure. In certain embodiments, referring to FIG. 18, a quantity of the connecting parts 50 connected to the padding metal 20 may be four. The fourth sub-frame region NA04 may include two connecting parts 50. The padding metal 20 may include a first end 20A and a second end 20B, the first end 20A may be connected to one connecting part 50, and the second end 20B may be connected to another one connecting part 50. The third sub-frame region NA03 located on an opposite side of the fourth sub-frame region NA04 may include another two connecting parts 50, and the two connecting parts 50 may be located on a side of the third sub-frame region NA03 adjacent to the first sub-frame region NA01 and on a side of the third sub-frame region NA03 adjacent to the second sub-frame region NA02, respectively.

The present disclosure may explain that in the display panel 000 with a square structure, the quantity of connecting parts 50 connected to the padding metal 20 may be set four. While improving the electrostatic discharge capability, the connecting parts may be prevented from occupying a substantially large space of the frame region NA. Among the four connecting parts 50, the fourth sub-frame region NA04 in the bonding region may include two connecting parts 50, and the two connecting parts 50 may be connected to the first end 20A and the second end 20B of the notch 201 of the padding metal 20, respectively. The remaining two connecting parts 50 may be symmetrically arranged within the range of the third sub-frame region NA03. For example, the remaining two connecting parts 50 may be arranged on the side of the third sub-frame region NA03 adjacent to the first sub-frame region NA01 and on the side of the third sub-frame region NA03 adjacent to the second sub-frame region NA02, respectively, which may facilitate to achieve the uniform electrostatic discharge effect.

Figure 19:
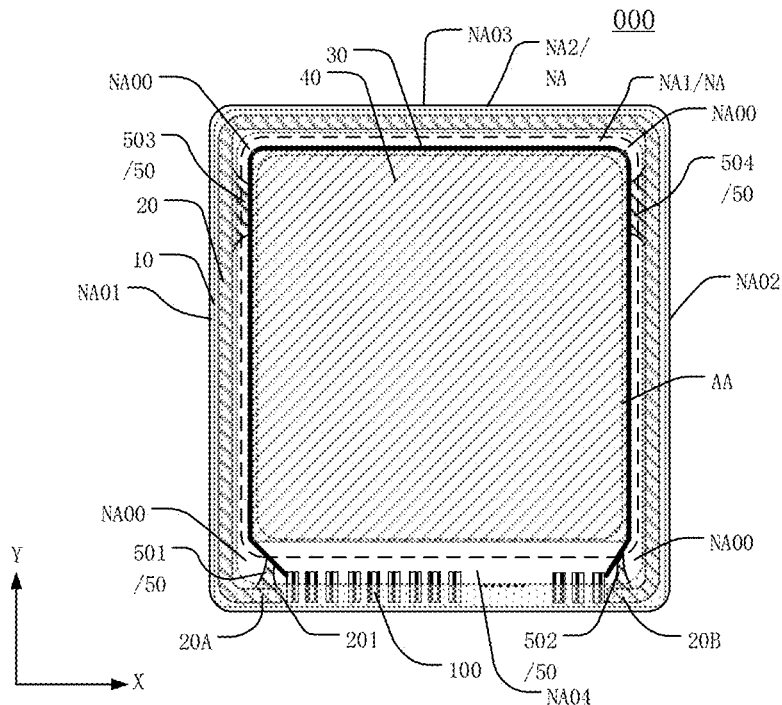
FIG. 19 illustrates a schematic top view of another exemplary display panel consistent with disclosed embodiments of the present disclosure.
Figure 20:
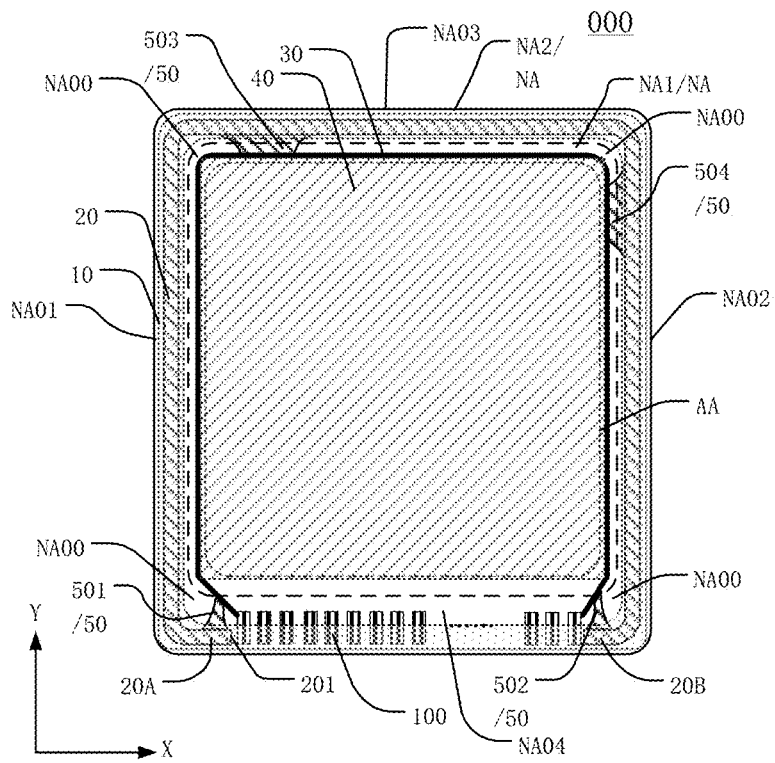
FIG. 20 illustrates a schematic top view of another exemplary display panel consistent with disclosed embodiments of the present disclosure.

FIG. 19 illustrates a schematic top view of another display panel consistent with disclosed embodiments of the present disclosure, and FIG. 20 illustrates a schematic top view of another display panel consistent with disclosed embodiments of the present disclosure. Optionally, referring to FIGS. 18-20, the padding metal 20 may be connected with four connecting parts 50, e.g., a first connecting part 501, a second connecting part 502, a third connecting part 503, and a fourth connecting part 504, respectively. The fourth sub-frame region NA04 may include the first connecting part 501 and the second connecting part 502. The padding metal 20 may include the first end 20A and the second end 20B. The first end 20A may be connected with the first connecting part 501, and the second end 20B may be connected with the second connecting part 502.

In one embodiment, referring to FIG. 18, the third sub-frame region NA03 may include a third connecting part 503 and a fourth connecting part 504. The third connecting part 503 may be located on the side of the third sub-frame region NA03 adjacent to the first sub-frame region NA01, and the fourth connecting part 504 may be located on the side of the third sub-frame region NA03 adjacent to the second sub-frame region NA02.

In another embodiment, referring to FIG. 19, the first sub-frame region NA01 may include the third connecting part 503, and the third connecting part 503 may be located on the side of the first sub-frame region NA01 adjacent to the third sub-frame region NA03. The second sub-frame region NA02 may include the fourth connecting part 504, and the fourth connecting part 504 may be located on the side of the second sub-frame region NA02 adjacent to the third sub-frame region NA03.

In another embodiment, referring to FIG. 20, the third sub-frame region NA03 may include the third connecting part 503, and the third connecting part 503 may be located on the side of the third sub-frame region NA03 adjacent to the first sub-frame region NA01. The second sub-frame region NA02 may include the fourth connecting part 504, and the fourth connecting part 504 may be located on the side of the second sub-frame region NA02 adjacent to the third sub-frame region NA03.

The present disclosure may explain that in the display panel 000 with a square structure, the quantity of connecting parts 50 connected to the padding metal 20 may be four. While improving the electrostatic discharge capability, the connecting parts may be prevented from occupying substantially large space of the frame region NA. Among the four connecting parts 50, the fourth sub-frame region NA04 in the bonding region may include the first connecting part 501 and the second connecting part 502, and the first connecting part 501 and the second connecting part 502 may be connected to the first end 20A and the second end 20B of the notch 201 of the padding metal 20, respectively. The remaining third connecting part 503 and the fourth connecting part 504 may be arranged opposite to the first connecting part 501 and the second connecting part 502, respectively, and may be arranged around the corner of the square display panel. While avoiding the corner sub-frame region NA00, the connecting parts 50 may be flexibly arranged to improve the electrostatic discharge capability.

Figure 21:
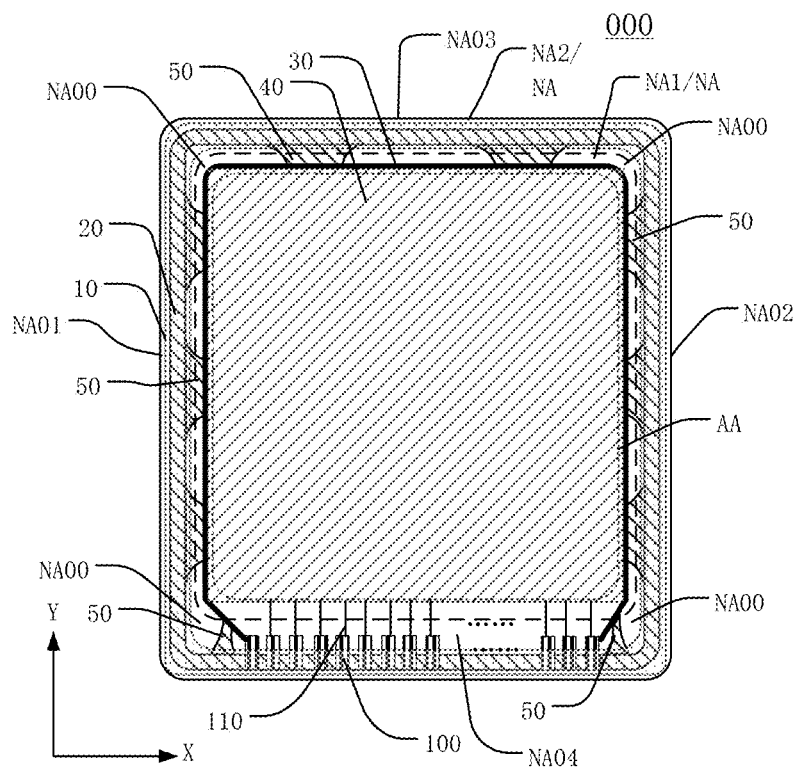
FIG. 21 illustrates a schematic top view of another exemplary display panel consistent with disclosed embodiments of the present disclosure.

FIG. 21 illustrates a schematic top view of another display panel consistent with disclosed embodiments of the present disclosure. In certain embodiments, referring to FIG. 21, the fourth sub-frame region NA04 may include a plurality of conductive pads 100. The padding metal 20 may have a ring structure, and the fourth sub-frame region NA04 may include a connecting line 110. The scan line and the data line each may be electrically connected to the conductive pad 100 through the connecting line 110, and the connecting line 110 may be disposed in a layer different from the padding metal 20.

The present disclosure may explain that the padding metal 20 may have a ring structure arranged around the display region AA, which may facilitate to further quickly disperse the static charge in the screen and to improve the electrostatic protection capability. The fourth sub-frame region NA04 may be the bonding region and may include the plurality of conductive pads 100. The plurality of conductive pads 100 may be configured to bond a driving chip or a flexible circuit board, and the conductive pad may be connected to the scan line and the data line (not illustrated in the Figure) of the display panel 000 through the connecting line 110. The connecting line 110 may refer to a fan-out line in a fan-out region, which may provide a driving signal for displaying for the display panel. In one embodiment, the padding metal 20 may have a ring structure arranged around the display region AA. By disposing the connecting line 110 and the padding metal 20 in different layers, the wiring of the connecting lines 110 may avoid the film layer where the padding metal 20 is located. Therefore, the padding metal may be prevented from being shorted with the connecting line 110.

Figure 22:
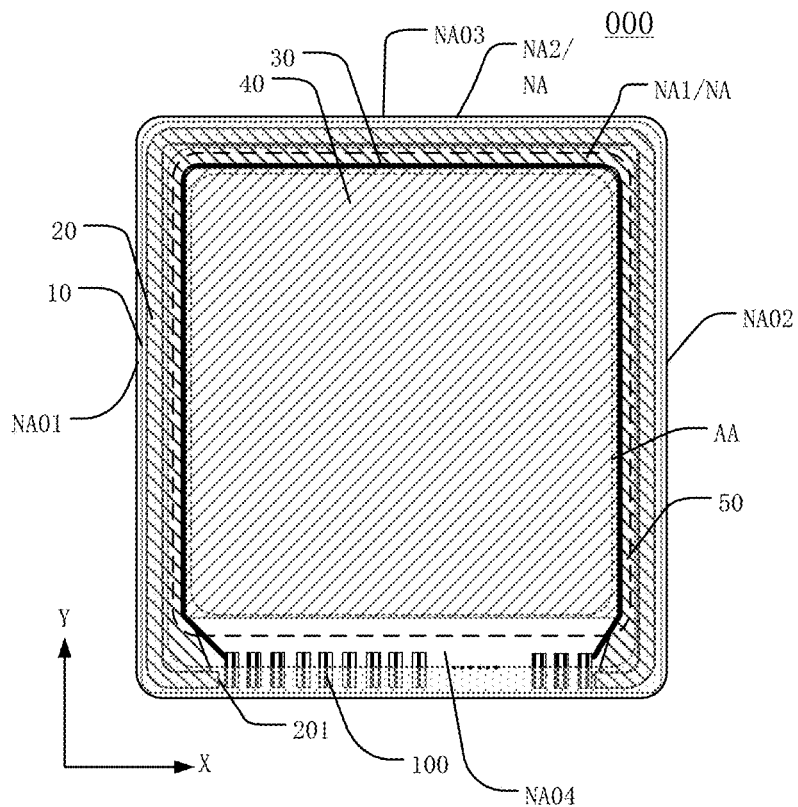
FIG. 22 illustrates a schematic top view of another exemplary display panel consistent with disclosed embodiments of the present disclosure.

FIG. 22 illustrates a schematic top view of another display panel consistent with disclosed embodiments of the present disclosure. In certain embodiments, referring to FIG. 22, the plurality of connecting parts 50 connected to the padding metal 20 may be connected to each other to form a structure at least partially surrounding the display region AA. Optionally, the padding metal 20 may have a ring structure containing the notch 201, and the notch 201 may be located in the fourth sub-frame region NA04. The plurality of connecting parts 50 may be connected to each other to form a ring structure with a notch corresponding to the padding metal 20.

The present disclosure may explain that the plurality of connecting parts 50 connected to the padding metal 20 may be connected to each other to form the structure at least partially surrounding the display region AA. Therefore, the overlapping method between the cathode signal line 30 multiplexed as an electrostatic ring and the padding metal 20 may be designed as a three-side surrounded uniform overlapping structure, which may facilitate to rapidly disperse static charge in the screen of the display panel, and to improve the electrostatic discharge capability of the screen.

Figure 23:
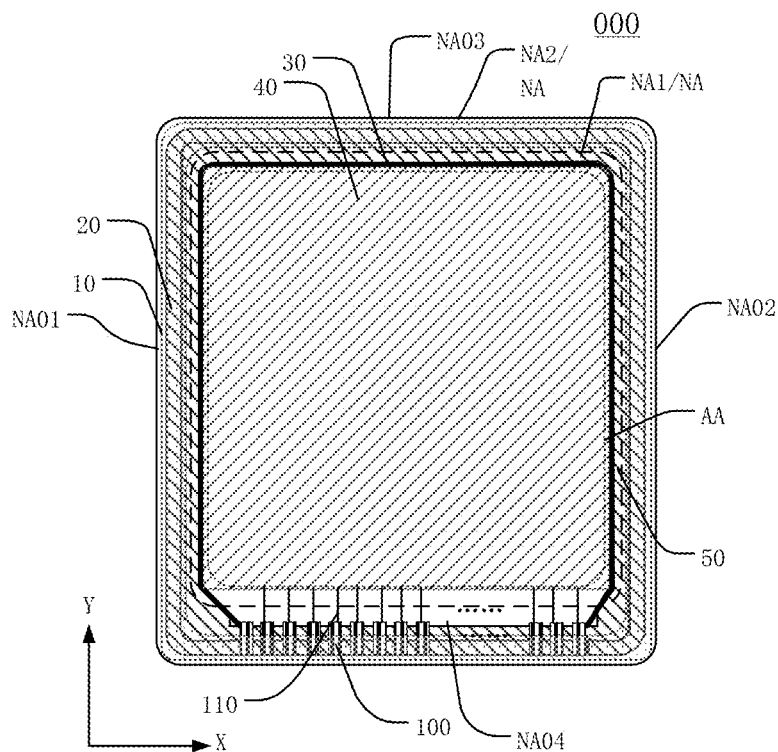
FIG. 23 illustrates a schematic top view of another exemplary display panel consistent with disclosed embodiments of the present disclosure.

FIG. 23 illustrates a schematic top view of another display panel consistent with disclosed embodiments of the present disclosure. In certain embodiments, referring to FIG. 23, the plurality of connecting parts 50 connected to the padding metal 20 may be connected to each other to form a structure at least partially surrounding the display region AA. Optionally, the plurality of connecting parts 50 connected to the padding metal 20 may be connected to each other to form a ring structure surrounding the display region AA. The padding metal 20 may be designed as a ring structure surrounding the display region AA.

The present disclosure may explain that the plurality of connecting parts 50 connected to the padding metal 20 may be connected to each other to form a ring structure disposed surrounding the display region AA. Therefore, the overlapping method between the cathode signal line 30 multiplexed as an electrostatic ring and the padding metal 20 may be designed as a full-circle uniform overlapping structure, which may facilitate to rapidly disperse static charge in the screen of the display panel, and to improve the electrostatic discharge capability of the screen.

Figure 24:
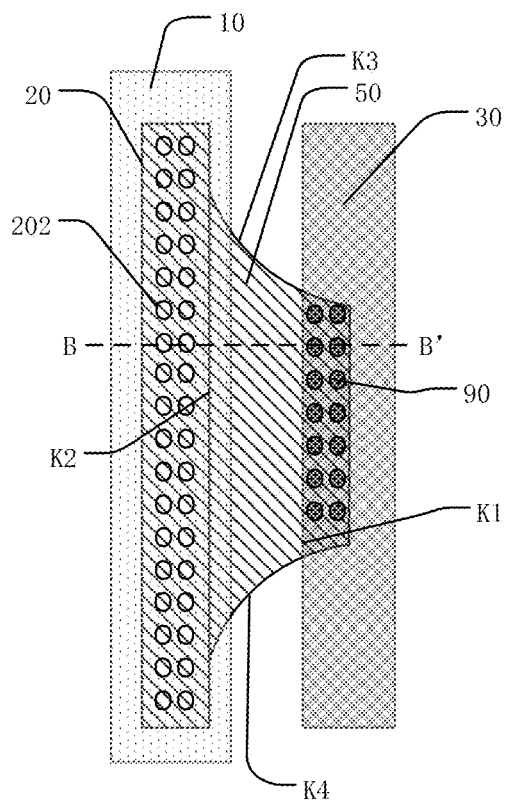
FIG. 24 illustrates a schematic local zoom-in top-view of a region G of another exemplary display panel in FIG. 17 consistent with disclosed embodiments of the present disclosure.
Figure 25:
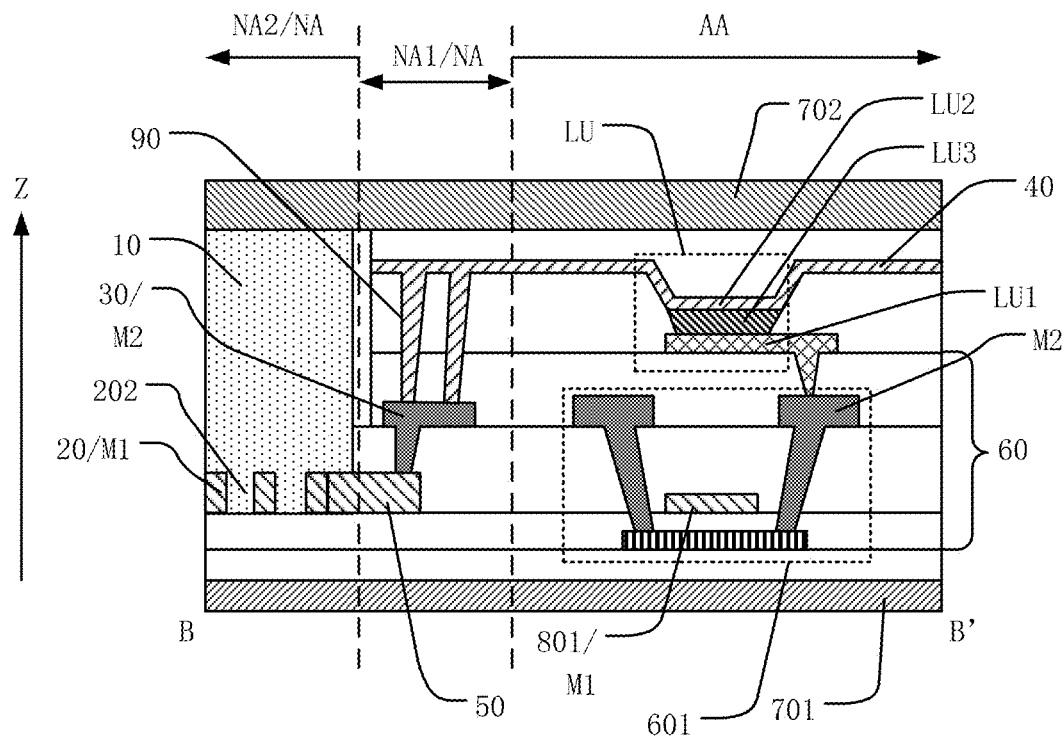
FIG. 25 illustrates a BB' sectional view of another exemplary display panel in FIG. 24 consistent with disclosed embodiments of the present disclosure.

FIG. 24 illustrates a schematic local zoom-in top-view of a region G of another display panel in FIG. 17 consistent with disclosed embodiments of the present disclosure; and FIG. 25 illustrates a BB' sectional view of the display panel in FIG. 24. In certain embodiments, referring to FIG. 17, FIG. 24 and FIG. 25, the padding metal 20 may include a plurality of hollow holes 202. The frame adhesive 10 may cover the hollow holes 202 along the direction Z perpendicular to the plane where the display panel 000 is located.

The present disclosure may explain that the plurality of hollow holes 202 may be formed on the padding metal 20 at least partially overlapping the frame adhesive 10. The hollow hole 202 may penetrate through the padding metal 20 along a thickness direction of the padding metal 20. Along the direction Z perpendicular to the plane where the display panel 000 is located, the frame adhesive 10 may cover the hollow holes 202. Because the padding metal 20 is made of a metal material and is capable of reflecting laser to enhance the effect of laser-assistant melting the frame adhesive 10. The frame adhesive 10 may be made of a frit material, and the frit material may have a substantially strong adhesion to the inorganic layer in the array layer, and may be used to seal the first substrate 701 and the second substrate 702 that are oppositely arranged. Therefore, in a case of achieving melting and solidifying the frame adhesive 10, the encapsulation reliability may increase, which may enable the light-emitting unit LU to be located in a closed cavity enclosed by the first substrate 701, the second substrate 702 and the frame adhesive 10, thereby preventing the penetration of external water and oxygen into the light-emitting device. Therefore, in the present disclosure, a plurality of hollow holes 202 may be formed in the padding metal 20, such that the frame adhesive 10 may pass through the hollow holes 202 to fix the first substrate 701 and the second substrate 702 to each other, which may facilitate to enhance the packaging effect of the display panel.

Figure 26:
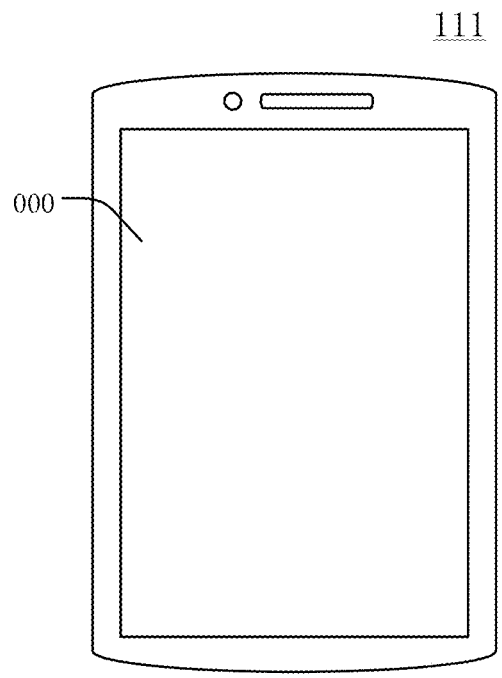
FIG. 26 illustrates a schematic top view of an exemplary display device consistent with disclosed embodiments of the present disclosure.

The present disclosure also provides a display device. FIG. 26 illustrates a schematic top view of a display device consistent with disclosed embodiments of the present disclosure. In one embodiment, referring to FIG. 26, the display device 111 may include the display panel 000 provided in the above-disclosed embodiments. For illustrative purposes, FIG. 26 illustrates a mobile phone as an example to describe the display device 111. The display device 111 may be a computer, a TV, a vehicle-mounted display device, or any other display device 111 with a display function, which may not be limited by the present disclosure. The display device 111 in the present disclosure may have the beneficial effects of the display panel 000 in the present disclosure, which may refer to specific descriptions of the display panel 000 in the foregoing embodiments, and may not be repeated herein.

The display panel and display device in the present disclosure may at least include following beneficial effects. In the present disclosure, the padding metal may be connected with at least one connecting part, and the connecting part may be located on the side of the padding metal adjacent to the first region. In other words, the connecting part may be located on the side of the padding metal adjacent to the display region, and the at least one connecting part may be connected with the cathode signal line. The cathode signal line at least partly surrounding the display region may be multiplexed as an electrostatic ring. The voltage signal of the cathode layer provided by the cathode signal line may often be a low (negative) voltage signal. With respect to the electrostatic ring of the ground signal, the cathode signal line multiplexed as an electrostatic ring may have better antistatic effect.

The display panel may use the cathode signal line as the electrostatic ring. Therefore, an additional electrostatic ring may not need to be disposed in the frame region, and an additional pad for providing ground signal may not need to be disposed within the frame region of the display panel for bonding a driving chip, which may facilitate to achieve the electrostatic protection effect, and at the same time, may facilitate to reduce the width of the frame region of the display panel, to achieve the narrow frame of the display panel.

At the same time, because the cathode signal line is connected to the cathode layer disposed as an entire surface within the range of the display region, when static charge strikes the screen of the display panel, the generated static charge may quickly enter the cathode layer disposed as an entire surface through the connecting part connected to the padding metal and the cathode signal line connected to the connecting part. In other words, the static charge may be quickly dispersed and released after entering the screen body of the display panel, thereby facilitating to improve the electro-static discharge capability of the display panel.

The cathode signal line multiplexed as an electrostatic ring may be located on the side of the frame adhesive adjacent to the display region. In other words, the padding metal may overlap the cathode signal line on the side of the frame adhesive adjacent to the display region. Because the frame adhesive has desired sealing performance for isolating water and oxygen, the cathode signal line multiplexed as the electrostatic ring and the connecting part connecting the padding metal and the cathode signal line may be disposed inside the first region, which may block the external water and oxygen, and avoid the phenomena of reducing the electro-static discharge performance due to corrosion of the electrostatic ring, thereby facilitating to improve the anti-static capability, and to improve the product yield and display quality.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel comprising:
a display region and a frame region surrounding the display region;
a frame adhesive located in the frame region;
a padding metal located in the frame region, along a direction perpendicular to a plane where the display panel is located, the padding metal at least partially overlapping the frame adhesive;
a cathode signal line located at a side of the frame adhesive adjacent to the display region;
a cathode located in the display region, the cathode is electrically connected to the cathode signal line; and
at least one connecting part electrically connected to the padding metal and electrically connected to the cathode signal line,
wherein:
along a first direction, the frame region includes a first sub-frame region and a second sub-frame region that are disposed on opposite sides of the display region;
along a second direction, the frame region includes a third sub-frame region and a fourth sub-frame region that are disposed on opposite sides of the display region, the first direction intersecting the second direction;
the at least one connecting part includes a plurality of connecting parts, both the first sub-frame region and the third sub-frame region include the plurality of connecting parts, and/or both the first sub-frame region and the second sub-frame region include the plurality of connecting parts;
the padding metal is a ring structure containing a notch;
the notch is located in the fourth sub-frame region of the frame region, and the fourth sub-frame region includes a fan-out line; and
the padding metal is not electrically connected to the fan-out line.

2. The display panel according to claim 1, wherein:
the at least one connecting part is located at a side of the padding metal adjacent to the display region.

3. The display panel according to claim 2, wherein:
the at least one connecting part and the padding metal are formed in a same layer.

4. The display panel according to claim 1, wherein:
the at least one connecting part at least partially surrounds the display region.

5. The display panel according to claim 1, wherein:
the at least one connecting part is a ring structure surrounding the display region.

6. The display panel according to claim 1, wherein:
all of the first sub-frame region, the second sub-frame region, the third sub-frame region, and the fourth sub-frame region include the plurality of connecting parts.

7. The display panel according to claim 6, wherein:
a distance between adjacent two connecting parts of the plurality of connecting parts in the second sub-frame region and/or the third sub-frame region is A, wherein $3\ \mu m \leq A \leq 100\ \mu m$.

8. The display panel according to claim 6, wherein:
a length of the first sub-frame region in the second direction is greater than a length of the third sub-frame region in the first direction; and
a quantity of the connecting parts in the first sub-frame region is greater than a quantity of the connecting parts in the third sub-frame region.

9. The display panel according to claim 1, wherein:
the display panel includes a plurality of corners, the plurality of corners are located in a corner sub-frame region of the frame region; and
along the direction perpendicular to the plane where the display panel is located, the at least one connecting part does not overlap the corner sub-frame region.

10. The display panel according to claim 1, wherein:
the display panel includes a first substrate and a second substrate that are oppositely disposed;
the frame adhesive is disposed between the first substrate and the second substrate; and
the padding metal is configured to reflect laser to cure the frame adhesive.

11. The display panel according to claim 10, wherein:
the display panel includes a plurality of scan lines extending along the first direction and a plurality of data lines extending along the second direction;
the first substrate includes a first metal layer and a second metal layer; and
the plurality of scan lines and the padding metal are located on the first metal layer, and/or the plurality of data lines and the cathode signal line are located on the second metal layer.

12. The display panel according to claim 11, wherein:
the fourth sub-frame region includes a plurality of conductive pads;
the notch is located in the fourth sub-frame region;
the fourth sub-frame region includes two connecting parts of the plurality of connecting part, the padding metal includes a first end and a second end, and the first end is connected to one of the two connecting parts, and the second end is connected to another one of the two connecting parts; and
the third sub-frame region includes another two connecting parts of the plurality of connecting part, and the another two connecting parts are located on a side of the third sub-frame region adjacent to the first sub-frame region and on a side of the third sub-frame region adjacent to the second sub-frame region, respectively.

13. The display panel according to claim 11, wherein:
the fourth sub-frame region includes a plurality of conductive pads;
the fourth sub-frame region includes a connecting line;
the plurality of scan lines and the plurality of data lines are electrically connected to the plurality of conductive pads through the connecting line; and
the connecting line and the padding metal are disposed in different layers.

14. The display panel according to claim 11, wherein:
the plurality of connecting parts are connected to each other, to form a structure at least partially surrounding the display region.

15. A display panel comprising:
a display region and a frame region surrounding the display region;
a frame adhesive located in the frame region;
a padding metal located in the frame region, along a direction perpendicular to a plane where the display panel is located, the padding metal at least partially overlapping the frame adhesive;
a cathode signal line located at a side of the frame adhesive adjacent to the display region;
a cathode located in the display region, the cathode is electrically connected to the cathode signal line; and
at least one connecting part electrically connected to the padding metal and electrically connected to the cathode signal line,
wherein:
the padding metal is a ring structure containing a notch;
the notch is located in a sub-frame region of the frame region, and the sub-frame region includes a fan-out line; and
the padding metal is not electrically connected to the fan-out line, and
wherein:
a shape of an orthographic projection of the at least one connecting part on the plane where the display panel is located is a first graph;
the first graph includes a first edge line adjacent to the display region, a second edge line far away from the display region, and a third edge line and a fourth edge line connecting the first edge line and the second edge line;
the first edge line and the second edge line are oppositely arranged, and the third edge line and the fourth edge line are oppositely arranged; and
a length of the first edge line is less than a length of the second edge line.

16. The display panel according to claim 15, wherein:
the shape of the orthographic projection of the at least one connecting part on the plane where the display panel is located is a trapezoid or a rounded trapezoid.

17. The display panel according to claim 15, wherein:
both the third edge line and the fourth edge line are arc lines; or
both the third edge line and the fourth edge line have a polyline structure including a plurality of sub-line segments.

18. The display panel according to claim 17, wherein:
the first graph has a geometric center point, the third edge line is recessed toward a direction approaching to the geometric center point, and the fourth edge line is recessed toward a direction approaching to the geometric center point.

19. The display panel according to claim 15, wherein:
the length of the first edge line is greater than or equal to 600 μm.

20. A display panel comprising:
a display region and a frame region surrounding the display region;
a frame adhesive located in the frame region;
a padding metal located in the frame region, along a direction perpendicular to a plane where the display panel is located, the padding metal at least partially overlapping the frame adhesive;
a cathode signal line located at a side of the frame adhesive adjacent to the display region;
a cathode located in the display region, the cathode is electrically connected to the cathode signal line; and
at least one connecting part electrically connected to the padding metal and electrically connected to the cathode signal line,
wherein:
the padding metal is a ring structure containing a notch;
the notch is located in a sub-frame region of the frame region, and the sub-frame region includes a fan-out line; and
the padding metal is not electrically connected to the fan-out line, and
wherein:
the at least one connecting part is connected to the cathode signal line through a plurality of vias; and
the plurality of vias are arranged in M rows and N columns, the N columns of vias extending along a column direction, the column direction being an extension direction of the cathode signal line, and a row direction intersecting with the column direction, wherein N is 2.

21. A display device comprising:
a display panel including:
a display region and a frame region surrounding the display region;
a frame adhesive located in the frame region;
a padding metal located in the frame region, along a direction perpendicular to a plane where the display panel is located, the padding metal at least partially overlapping the frame adhesive;
a cathode signal line located at a side of the frame adhesive adjacent to the display region;
a cathode located in the display region, the cathode is electrically connected to the cathode signal line; and
at least one connecting part electrically connected to the padding metal and electrically connected to the cathode signal line,
wherein:
along a first direction, the frame region includes a first sub-frame region and a second sub-frame region that are disposed on opposite sides of the display region;
along a second direction, the frame region includes a third sub-frame region and a fourth sub-frame region that are disposed on opposite sides of the display region, the first direction intersecting the second direction;
the at least one connecting part includes a plurality of connecting parts, both the first sub-frame region and the third sub-frame region include the plurality of connecting parts, and/or both the first sub-frame region and the second sub-frame region include the plurality of connecting parts;
the padding metal is a ring structure containing a notch;

the notch is located in the fourth sub-frame region of the frame region, and the fourth sub-frame region includes a fan-out line; and the padding metal is not electrically connected to the fan-out line.

* * * * *